(12) United States Patent
Elliott et al.

(10) Patent No.: US 7,914,248 B2
(45) Date of Patent: Mar. 29, 2011

(54) METHODS AND APPARATUS FOR REPOSITIONING SUPPORT FOR A SUBSTRATE CARRIER

(75) Inventors: Martin R. Elliott, Pepperall, MA (US); Michael Robert Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/185,786

(22) Filed: Aug. 4, 2008

(65) Prior Publication Data

US 2008/0286076 A1    Nov. 20, 2008

Related U.S. Application Data

(62) Division of application No. 11/180,029, filed on Jul. 12, 2005, now Pat. No. 7,409,263.

(60) Provisional application No. 60/587,752, filed on Jul. 14, 2004.

(51) Int. Cl.
*B65G 47/90* (2006.01)
(52) U.S. Cl. ............. 414/618; 294/2; 700/218; 414/941
(58) Field of Classification Search .................. 414/217, 414/618, 731, 736, 941; 294/1.1, 2; 700/218
See application file for complete search history.

(56) References Cited

U.S. PATENT DOCUMENTS

| | | | |
|---|---|---|---|
| 4,449,885 A | 5/1984 | Hertel et al. | |
| 4,776,744 A | 10/1988 | Stonestreet et al. | |
| 4,859,137 A | 8/1989 | Bonora et al. | |
| 4,861,222 A | 8/1989 | Mirkovich | |
| 4,886,412 A | 12/1989 | Wooding et al. | |
| 5,169,272 A | 12/1992 | Bonora et al. | |
| 5,246,218 A * | 9/1993 | Yap et al. | 269/309 |
| 5,256,204 A | 10/1993 | Wu | |
| 5,360,106 A | 11/1994 | Nakayama et al. | |
| 5,370,491 A | 12/1994 | Bonora et al. | |
| 5,372,471 A | 12/1994 | Wu | |
| 5,607,276 A | 3/1997 | Muka et al. | |
| 5,615,988 A | 4/1997 | Wiesler et al. | |
| 5,664,925 A | 9/1997 | Muka et al. | |
| 5,668,056 A | 9/1997 | Wu et al. | |

(Continued)

FOREIGN PATENT DOCUMENTS

EP    0 472 536    12/1994

(Continued)

OTHER PUBLICATIONS

Elliott et al., U.S. Appl. No. 12/359,310, filed Jan. 24, 2009.

(Continued)

*Primary Examiner* — Saúl J Rodríguez
*Assistant Examiner* — Joshua I Rudawitz
(74) *Attorney, Agent, or Firm* — Dugan & Dugan

(57) ABSTRACT

In a first aspect, a first method is provided repositioning support provided by an end effector. The first method includes the steps of (1) employing the end effector to support a substrate carrier by a bottom of the substrate carrier; (2) transferring the substrate carrier from the end effector to an intermediate support location, wherein the intermediate support location supports the substrate carrier by a bottom of the substrate carrier; (3) repositioning the end effector proximate an overhead transfer flange of the substrate carrier; (4) employing the end effector to support the substrate carrier by the overhead transfer flange of the substrate carrier; and (5) transferring the substrate carrier from the intermediate support location. Numerous other aspects are provided.

8 Claims, 20 Drawing Sheets

U.S. PATENT DOCUMENTS

| | | | |
|---|---|---|---|
| 5,674,039 | A | 10/1997 | Walker et al. |
| 5,713,711 | A | 2/1998 | McKenna et al. |
| 5,752,796 | A | 5/1998 | Muka |
| 5,772,386 | A | 6/1998 | Mages et al. |
| 5,788,454 | A | 8/1998 | Thompson et al. |
| 5,870,488 | A | 2/1999 | Rush et al. |
| 5,931,631 | A | 8/1999 | Bonora et al. |
| 5,950,643 | A | 9/1999 | Miyazaki et al. |
| 5,976,199 | A | 11/1999 | Wu et al. |
| 5,980,183 | A * | 11/1999 | Fosnight .................. 414/222.01 |
| 6,014,817 | A | 1/2000 | Thompson et al. |
| 6,042,324 | A | 3/2000 | Aggarwal et al. |
| 6,048,259 | A | 4/2000 | Asai |
| 6,053,688 | A | 4/2000 | Cheng |
| 6,135,168 | A | 10/2000 | Yang et al. |
| 6,165,268 | A | 12/2000 | Ow et al. |
| 6,183,186 | B1 | 2/2001 | Howells et al. |
| 6,249,342 | B1 | 6/2001 | Cheng |
| 6,281,516 | B1 | 8/2001 | Bacchi et al. |
| 6,283,692 | B1 * | 9/2001 | Perlov et al. ............. 414/222.01 |
| 6,506,009 | B1 | 1/2003 | Nulman et al. |
| 6,579,052 | B1 | 6/2003 | Bonora et al. |
| 6,677,690 | B2 * | 1/2004 | Fosnight et al. .............. 307/326 |
| 6,955,517 | B2 | 10/2005 | Nulman et al. |
| 7,039,499 | B1 | 5/2006 | Nasr et al. |
| 7,051,870 | B2 | 5/2006 | Schoendienst et al. |
| 7,077,614 | B1 * | 7/2006 | Hasper et al. ................. 414/217 |
| 7,168,553 | B2 | 1/2007 | Rice et al. |
| 7,230,702 | B2 | 6/2007 | Rice et al. |
| 7,234,584 | B2 | 6/2007 | Rice et al. |
| 7,234,908 | B2 | 6/2007 | Nulman et al. |
| 7,243,003 | B2 | 7/2007 | Elliott et al. |
| 7,346,431 | B2 | 3/2008 | Elliott et al. |
| 7,359,767 | B2 | 4/2008 | Elliott et al. |
| 7,360,981 | B2 | 4/2008 | Weaver |
| 7,409,263 | B2 | 8/2008 | Elliott et al. |
| 7,433,756 | B2 | 10/2008 | Rice et al. |
| 2001/0043849 | A1 | 11/2001 | Perlov et al. |
| 2002/0090282 | A1 | 7/2002 | Bachrach |
| 2003/0031538 | A1 | 2/2003 | Weaver |
| 2003/0110649 | A1 | 6/2003 | Hudgens |
| 2003/0202865 | A1 | 10/2003 | Ponnekanti et al. |
| 2003/0202868 | A1 | 10/2003 | Bachrach |
| 2004/0081546 | A1 | 4/2004 | Elliott et al. |
| 2004/0191042 | A1 * | 9/2004 | Chen et al. .................... 414/618 |
| 2005/0040662 | A1 * | 2/2005 | Rice et al. ....................... 294/92 |
| 2005/0135903 | A1 | 6/2005 | Rice et al. |
| 2005/0167554 | A1 | 8/2005 | Rice et al. |
| 2005/0240290 | A1 | 10/2005 | Stone et al. |
| 2006/0072986 | A1 | 4/2006 | Perlov et al. |
| 2007/0237609 | A1 | 10/2007 | Nulman et al. |
| 2007/0258796 | A1 | 11/2007 | Englhardt et al. |
| 2007/0274813 | A1 | 11/2007 | Elliott et al. |
| 2008/0050217 | A1 | 2/2008 | Rice et al. |
| 2008/0051925 | A1 | 2/2008 | Rice et al. |
| 2008/0071417 | A1 | 3/2008 | Rice et al. |
| 2008/0187414 | A1 | 8/2008 | Elliott et al. |
| 2008/0187419 | A1 | 8/2008 | Rice et al. |
| 2008/0213068 | A1 | 9/2008 | Weaver |
| 2009/0030547 | A1 | 1/2009 | Rice et al. |

FOREIGN PATENT DOCUMENTS

| | | |
|---|---|---|
| EP | 0 651 429 | 5/1995 |
| EP | 0 556 193 | 12/1995 |
| EP | 0 663 686 | 6/1997 |
| EP | 0 795 892 | 9/1997 |
| JP | 04-179143 | 6/1992 |
| JP | 2000-068350 | 3/2000 |
| JP | 2002-265011 | 9/2002 |
| JP | 2005-136294 | 5/2005 |
| TW | 325777 | 1/1998 |
| TW | 494079 | 7/2002 |
| TW | 494910 | 7/2002 |
| TW | 593080 | 6/2004 |
| WO | WO 97/03001 | 1/1997 |
| WO | WO 98/46503 | 10/1998 |
| WO | WO 99/32381 | 7/1999 |
| WO | WO 00/32472 | 6/2000 |
| WO | WO 00/59004 | 10/2000 |
| WO | WO 00/67334 | 11/2000 |
| WO | WO 01/10756 | 2/2001 |
| WO | WO 03/105216 | 12/2003 |

OTHER PUBLICATIONS

Martin, et al., "Design Criteria for 300 mm Silicon Wafer Carriers, Material Handling Systems & Tools", 1995, Proceedings of the 41st Annual Technical Meeting of the Institute of Environmental Sciences, pp. 107-117.

Weiss, Mitchell, "Evaluating 300-mm Fab Automation Technology Options and Selection Criteria", Jun. 1997, Micro, vol. 15, No. 6, pp. 65-66, 68, 70, 72, 74, 76, 78-79.

No-Author, "Equipe Helps Streamline 300 mm Wafer Processing", Dec. 1, 1997, Manufacturing Automation, vol. 7, No. 3, p. 1-5.

Kobayashi, et al., "Particle Characteristics of 300-mm Minienvironment (FOUP and LPU)", 1999, Proceedings of 1999 IEEE International Symposium on Semiconductor Manufacturing Conference Proceedings, pp. 39-42.

Office Action of Chinese Patent Application No. 200510113300.1 dated Jul. 18, 2008.

Second Office Action of Chinese Patent Application No. 200510113300.1 dated Jun. 5, 2009.

Search Report of Taiwan Patent Application No. 094123962 dated Aug. 16, 2008.

Office Action of U.S. Appl. No. 11/180,029 mailed Jul. 13, 2007.

Jan. 14, 2008 Response to Office Action of U.S. Appl. No. 11/180,029 mailed Jul. 13, 2007.

Notice of Allowance of U.S. Appl. No. 11/180,029 mailed Apr. 24, 2008.

Restriction Requirement of U.S. Appl. No. 11/180,029 mailed Apr. 2, 2007.

Apr. 18, 2007 Reply to Restriction Requirement of U.S. Appl. No. 11/180,029 mailed Apr. 2, 2007.

* cited by examiner

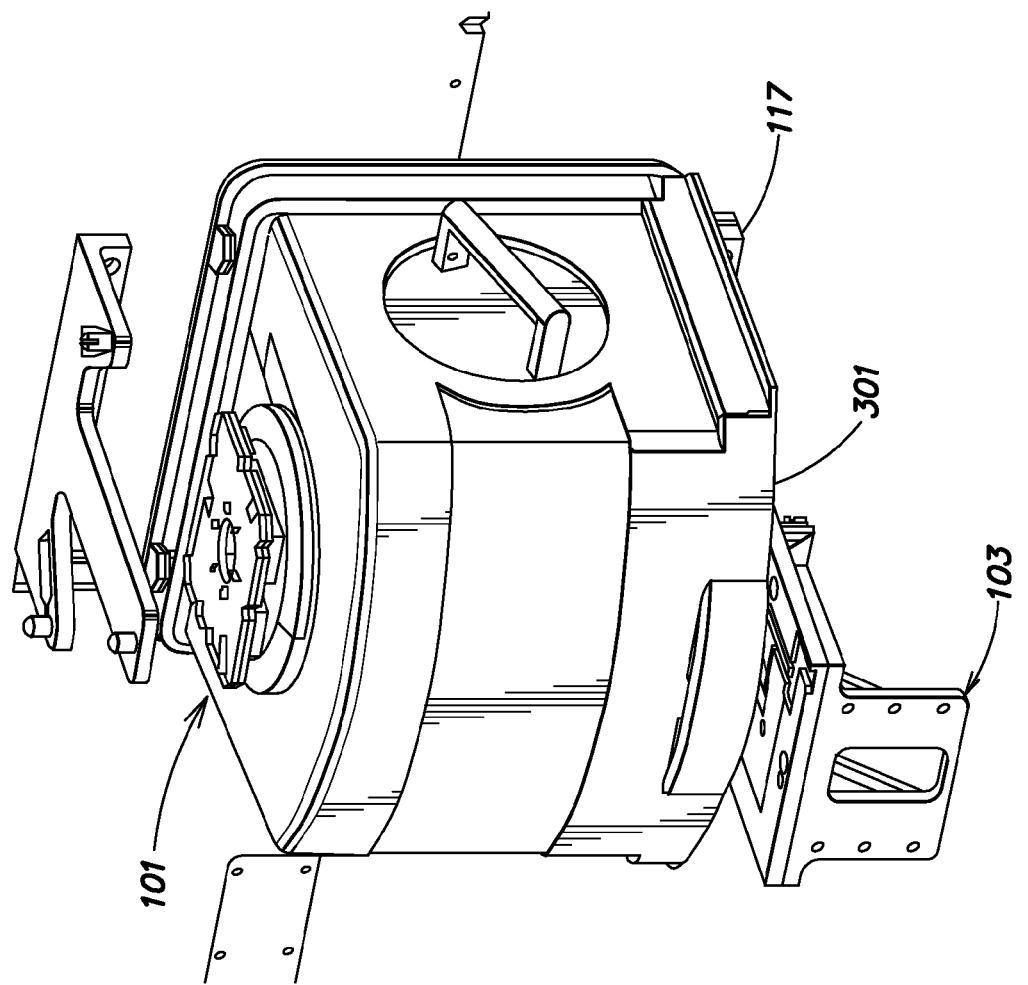
FIG. 9
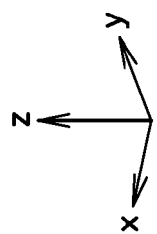

METHODS AND APPARATUS FOR REPOSITIONING SUPPORT FOR A SUBSTRATE CARRIER

This application is a division of and claims priority to U.S. Non-Provisional patent application Ser. No. 11/180,029, filed Jul. 12, 2005, now U.S. Pat. No. 7,409,263 which claims priority to U.S. Provisional Patent Application Ser. No. 60/587,752, filed Jul. 14, 2004. Both of these patent applications are incorporated herein by reference in their entirety.

CROSS REFERENCE TO RELATED APPLICATIONS

The present application is related to the following commonly-assigned, co-pending U.S. Patent Applications, each of which is hereby incorporated by reference herein in its entirety:

U.S. patent application Ser. No. 10/650,310, filed Aug. 28, 2003 and titled "System For Transporting Substrate Carriers"; and U.S. patent application Ser. No. 10/650,480, filed Aug. 28, 2003 and titled "Substrate Carrier Handler That Unloads Substrate Carriers Directly From a Moving Conveyor".

FIELD OF THE INVENTION

The present invention relates generally to semiconductor device manufacturing, and more particularly to methods and apparatus for repositioning support for a substrate carrier.

BACKGROUND OF THE INVENTION

Manufacturing of semiconductor devices typically involves performing a sequence of procedures with respect to a substrate such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending on the type of semiconductor device to be manufactured, there may be a relatively large number of processing steps required, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device. However, a need remains for improved methods and apparatus for supporting substrate carriers during transport operations.

SUMMARY OF THE INVENTION

In a first aspect of the invention, a first method is provided for repositioning support provided by an end effector. The first method includes the steps of (1) employing the end effector to support a substrate carrier by a bottom of the substrate carrier; (2) transferring the substrate carrier from the end effector to an intermediate support location, wherein the intermediate support location supports the substrate carrier by a bottom of the substrate carrier; (3) repositioning the end effector proximate an overhead transfer flange of the substrate carrier; (4) employing the end effector to support the substrate carrier by the overhead transfer flange of the substrate carrier; and (5) transferring the substrate carrier from the intermediate support location.

In a second aspect of the invention, a second method is provided for repositioning support provided by an end effector. The second method includes the steps of (1) employing the end effector to support a substrate carrier by an overhead transfer flange of the substrate carrier; (2) transferring the substrate carrier from the end effector to an intermediate support location, wherein the intermediate support location supports the substrate carrier by a bottom of the substrate carrier; (3) repositioning the end effector proximate the bottom of the substrate carrier; (4) employing the end effector to support the substrate carrier by the bottom of the substrate carrier; and (5) transferring the substrate carrier from the intermediate support location.

In a third aspect of the invention, a first substrate carrier transferring system is provided. The first substrate carrier transferring system includes (1) an end effector adapted to support a substrate carrier by a bottom of the substrate carrier and support the substrate carrier by an overhead transfer flange of the substrate carrier; (2) an intermediate support location; and (3) a controller coupled to the end effector and adapted to (a) employ the end effector to support the substrate carrier by the bottom of the substrate carrier; (b) transfer the substrate carrier from the end effector to the intermediate support location, wherein the intermediate support location supports the substrate carrier by the bottom of the substrate carrier; (c) reposition the end effector proximate the overhead transfer flange of the substrate carrier; (d) employ the end effector to support the substrate carrier by the overhead transfer flange of the substrate carrier; and (e) transfer the substrate carrier from the intermediate support location.

In a fourth aspect of the invention, a second substrate carrier transferring system is provided. The second substrate carrier transferring system includes (1) an end effector adapted to support a substrate carrier by a bottom of the substrate carrier and support the substrate carrier by an overhead transfer flange of the substrate carrier; (2) an intermediate support location; and (3) a controller coupled to the end effector and adapted to (a) employ the end effector to support the substrate carrier by the overhead transfer flange of the substrate carrier; (b) transfer the substrate carrier from the end effector to the intermediate support location, wherein the intermediate support location supports the substrate carrier by the bottom of the substrate carrier; (c) reposition the end effector proximate the bottom of the substrate carrier; (d) employ the end effector to support the substrate carrier by the bottom of the substrate carrier; and (e) transfer the substrate carrier from the intermediate support location. Numerous other aspects are provided, as are methods, systems, apparatus and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

BRIEF DESCRIPTION OF THE DRAWINGS

FIG. 9 illustrates the intermediate support location of FIG. 7 employed to support the bottom side of the FOUP in accordance with an embodiment of the present invention.

DETAILED DESCRIPTION

A substrate carrier, such as a conventional front opening unified pod (FOUP), may store one or more substrates. During a semiconductor device manufacturing process, the substrate carrier is transferred from a first location to a second location of the semiconductor device manufacturing facility using a transporting device, such as an end effector of a robot arm. The transporting device may transfer (e.g., by lifting) the substrate carrier from the first location by supporting a first end (e.g., a top end) of the substrate carrier. In accordance with the present invention, however, the transporting device may then transfer the substrate carrier to the second location by supporting a second end (e.g., a bottom end) of the substrate carrier or vice versa. For example, the support provided to the substrate carrier may be repositioned from the first end to the second end of the substrate carrier during transfer. Accordingly, the present methods and apparatus provide for repositioning support of a substrate carrier.

Figure 1:
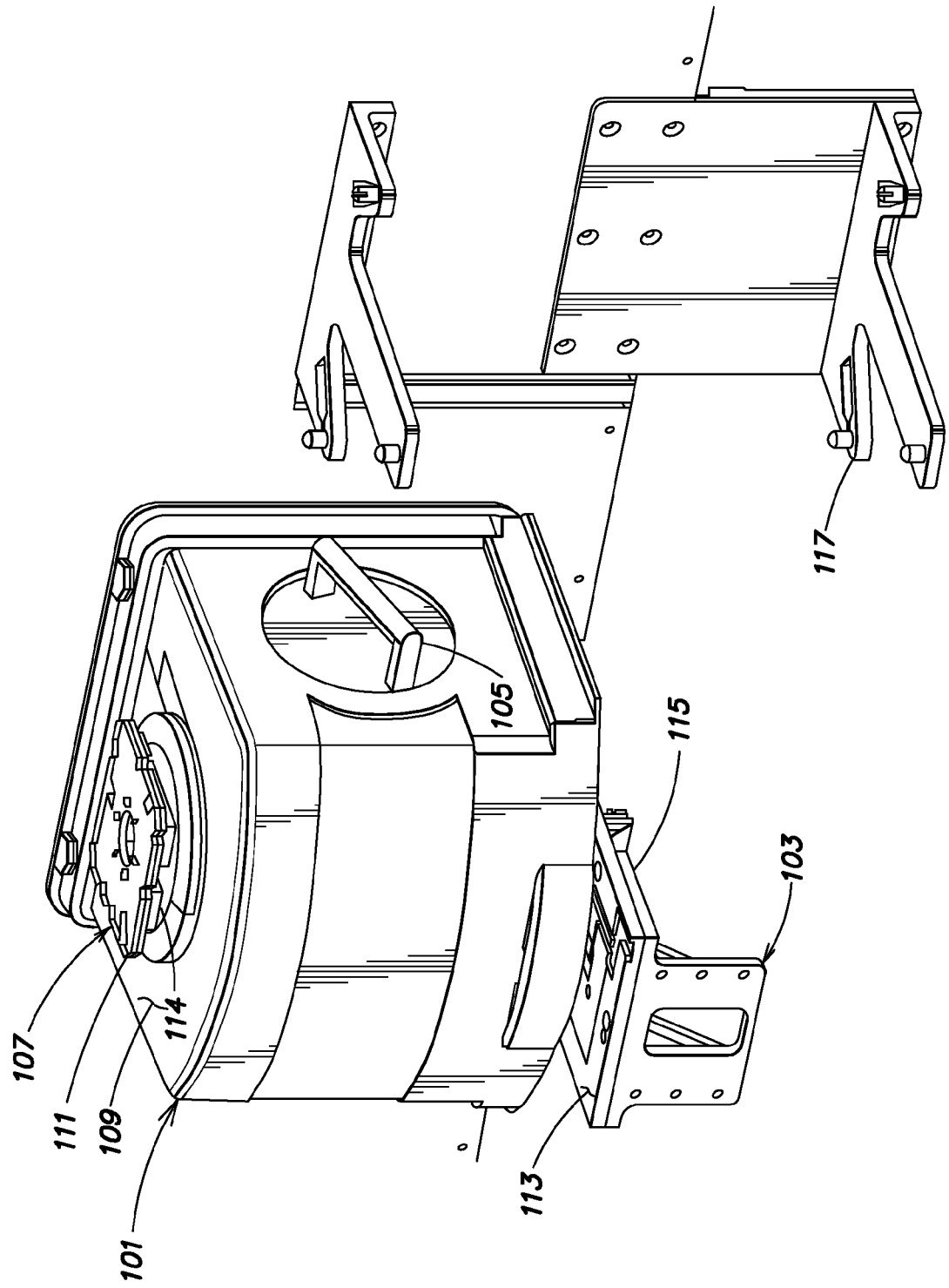
FIG. 1 is an isometric view of a conventional front opening unified pod (FOUP) being supported by an end effector in accordance with an embodiment of the present invention.

FIG. 1 is an isometric view of a conventional front opening unified pod (FOUP) 101 being supported by an end effector 103 in accordance with an embodiment of the present invention. In one embodiment, the FOUP 101 may be a cube. Although shown as a cube in FIG. 1, the FOUP 101 may assume other shapes. The FOUP 101 may include a plurality of sides or surfaces including a top side 109 and a bottom side (not shown in FIG. 1). The FOUP 101 may include a handle 105 on one or more sides, which may be used for manually carrying the FOUP 101. The FOUP 101 includes an overhead transfer (OHT) flange 107 coupled to the top side or surface 109 of the FOUP 101. The OHT flange 107 may include a plurality of flanges 111 on and/or extending from a base 114. The OHT flange 107 or the bottom side (not shown in FIG. 1) of the FOUP 101 are adapted to couple to a transporting device, such as the end effector 103.

The end effector 103 includes a top side 113 and a bottom side 115. Details of the top side 113 and the bottom side 115 of the end effector 103 are described below with reference to FIGS. 4 and 5, respectively. The end effector 103 may be employed for supporting the FOUP 101, for example, during transfer. More specifically, the bottom side 115 of the end effector 103 may support the FOUP 101 using (e.g., by) a top side 109 of the FOUP 101 (e.g., the OHT flange 107). Alternatively, as shown in FIG. 1, the top side 113 of the end effector 103 may support the FOUP 101 using (e.g., by) the bottom side of the FOUP 101.

FIG. 1 includes an isometric view of an intermediate support location 117 in accordance with an embodiment of the present invention. In one embodiment, the intermediate support location 117 may be a shelf. The intermediate support location 117 may include other types of supports. The intermediate support location 117 supports the FOUP 101 while the end effector 103 is repositioned from providing support to a first side (e.g., the bottom side) of the FOUP 101 to a second side (e.g., the top side 109) of the FOUP 101 (or vice versa). In the embodiment shown in FIG. 1, the intermediate support location 117 supports the FOUP 101 by the bottom side (not shown in FIG. 1) of the FOUP 101. In other embodiments, the intermediate support location 117 may support the FOUP 101 by another and/or additional sides of the FOUP 101.

Figure 2:
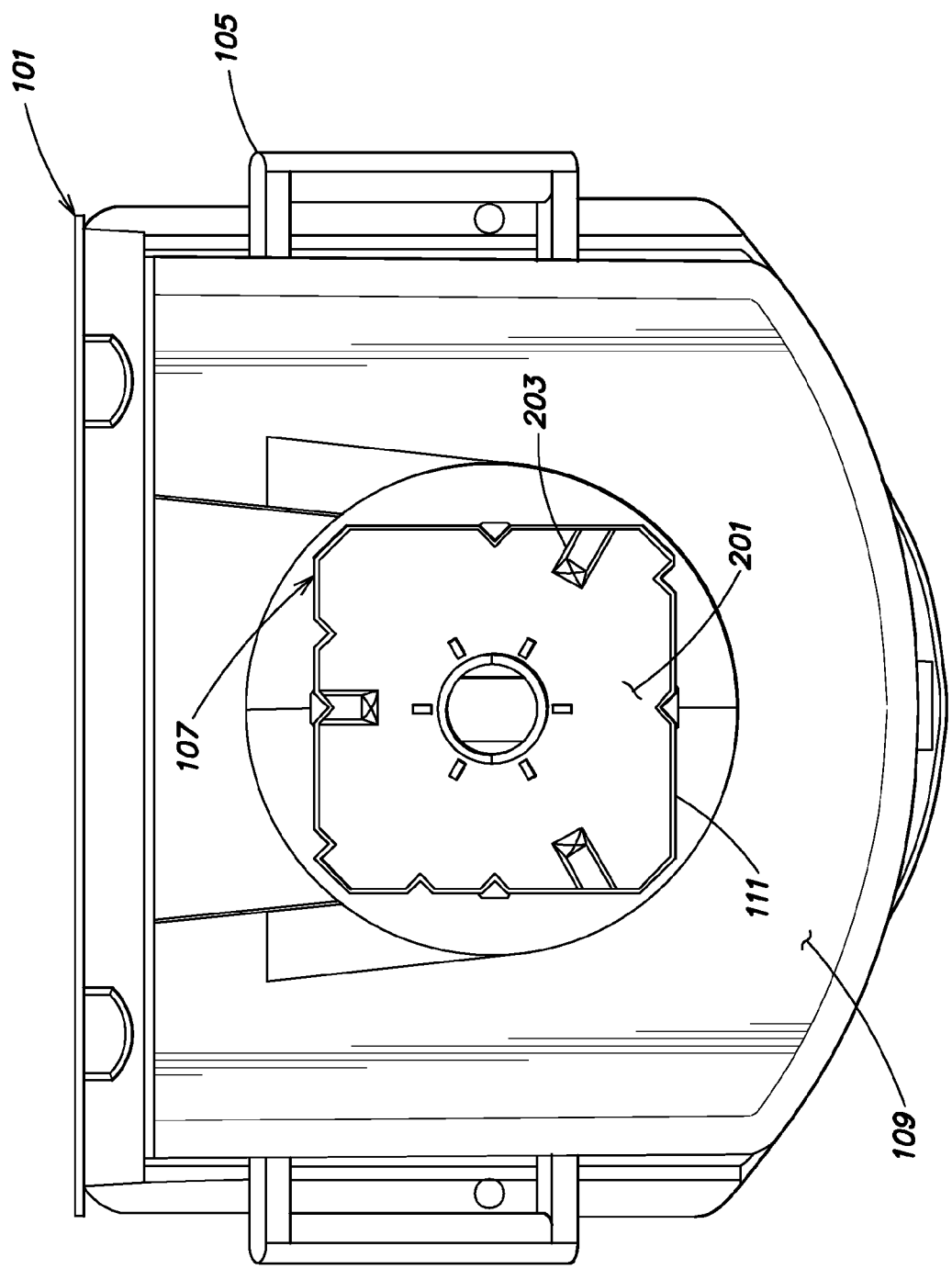
FIG. 2 is a top view of the FOUP of FIG. 1.

FIG. 2 is a top view of the FOUP 101 of FIG. 1. A top surface 201 of the OHT flange 107 may include one or more flange slots 203 for providing alignment with the end effector 103 or a support device, such as the intermediate support location 117 of FIG. 1. In one embodiment, the top surface 201 or bottom surface (not shown) of the OHT flange 107 includes three flange slots 203. Other numbers of slots 203 may be employed. Further, different embodiments may include slots 203 of different lengths, depths and/or shapes and/or slot locations.

Figure 3:
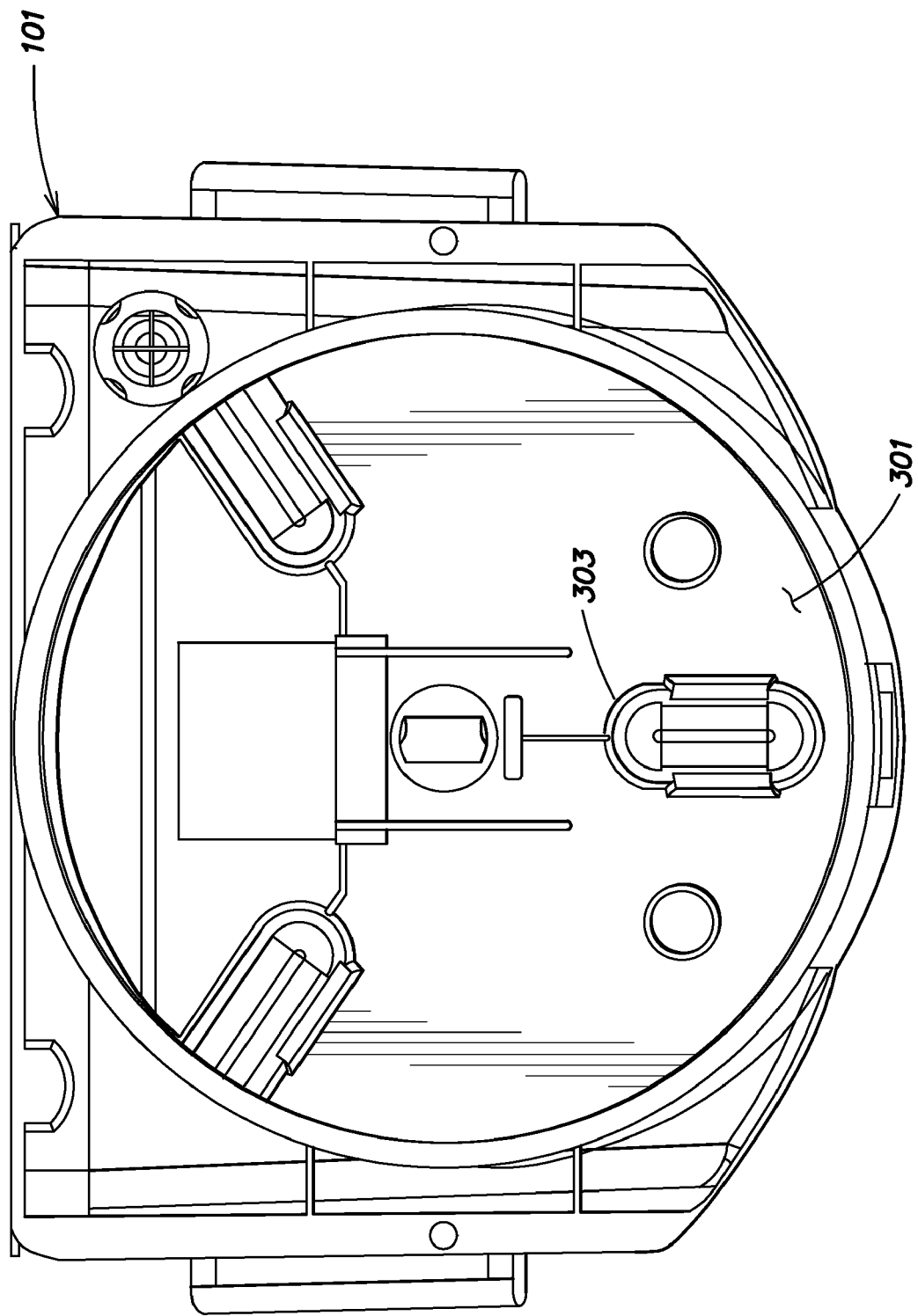
FIG. 3 is a bottom view of the FOUP of FIG. 1.

FIG. 3 is a bottom view of the FOUP 101 of FIG. 1. The bottom surface 301 of the FOUP 101 includes one or more FOUP slots 303 for providing alignment with the end effector 103 or a support device, such as the intermediate support location 117 of FIG. 1. In one embodiment, the bottom surface 301 of the FOUP 101 includes three FOUP slots 303. Other numbers of FOUP slots 303 may be employed. Further, different embodiments may include FOUP slots 303 of different lengths, depths, shapes and/or slot locations.

Figure 4:
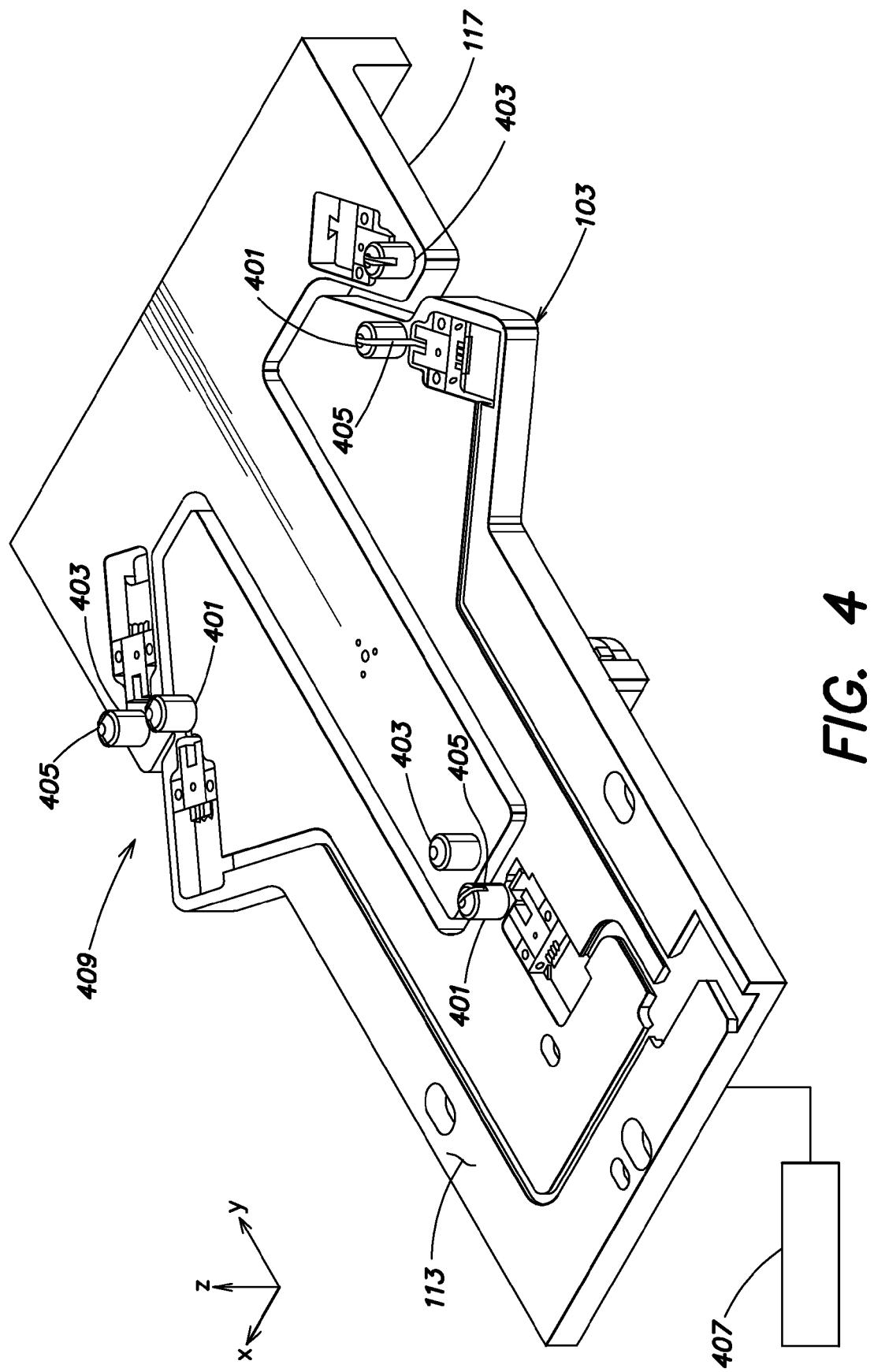
FIG. 4 is an isometric view of the end effector and an intermediate support location of FIG. 1 in accordance with an embodiment of the present invention.

FIG. 4 is an isometric view of the end effector 103 and the intermediate support location 117 of FIG. 1 in accordance with an embodiment of the present invention. The top surface 113 of the end effector 103 may include one or more end effector pins 401. The one or more end effector pins 401 couple to (e.g., are inserted in) corresponding FOUP slots 303 (FIG. 3) included in the bottom surface 301 of the FOUP 101 when the end effector supports the bottom surface 301 of the FOUP 101. The FOUP slots 303 and the one or more end effector pins 401 are designed such that coupling the one or more end effector pins 401 with corresponding FOUP slots 303 aligns the FOUP 101 with the end effector 103. Similarly, the intermediate support location 117 may include one or more support location pins 403 (e.g., on a top side of the support location). The one or more support location pins 403 couple to (e.g., are inserted in) corresponding FOUP slots 303 when the intermediate support location 117 supports the bottom surface of the FOUP 101. The FOUP slots 303 and the one or more support location pins 403 are designed such that coupling the one or more support location pins 403 with corresponding FOUP slots 303 aligns the FOUP 101 with the intermediate support location 117. In the embodiment of FIG. 4, three end effector pins 401 and/or three support location pins 403 are employed, although other numbers of pins may be used. In one embodiment, the one or more end effector pins 401 and/or the one or more support location pins 403 are kinematic pins. Other types of pins may be employed. Further, the one or more end effector pins 401 and/or support location pins 403 may include sensors 405 (e.g., for detecting accurate carrier placement). Kinematic pins that employ sensors are described in U.S. Pat. No. 6,573,522 B2, filed Jun. 3, 2003 and titled "LOCATOR PIN INTEGRATED WITH SENSOR FOR DETECTING SEMICONDUCTOR SUBSTRATE CARRIER," which is hereby incorporated by reference herein in its entirety.

The end effector 103 may be coupled to a controller 407, which is adapted to move (e.g., control movement of) the end effector 103 in one or more directions. For example, the controller 407 may be adapted to move the end effector along the x-axis, y-axis and/or z-axis (FIG. 4). The end effector 103, the intermediate support location 117 and the controller 407 may form a substrate carrier transferring system 409.

In the embodiment of FIG. 4, the shape of the end effector 103 and the positioning of the one or more end effector pins 401 are designed to compliment the shape of the intermediate support location 117 and the positioning of the of the one or more support location pins 403 thereon. More specifically, when the end effector 103 and the intermediate support location 117 are in the same plane (e.g., xy-plane), each of the end effector pins 401 of the end effector 103 and each corresponding support location pin 403 of the intermediate support location 117 may couple to (e.g., be inserted in) a respective FOUP slot 303. During this time, both the end effector 103 and the intermediate support location 117 may support the FOUP 101 (e.g., via a bottom surface of the FOUP 101).

Figure 5A:
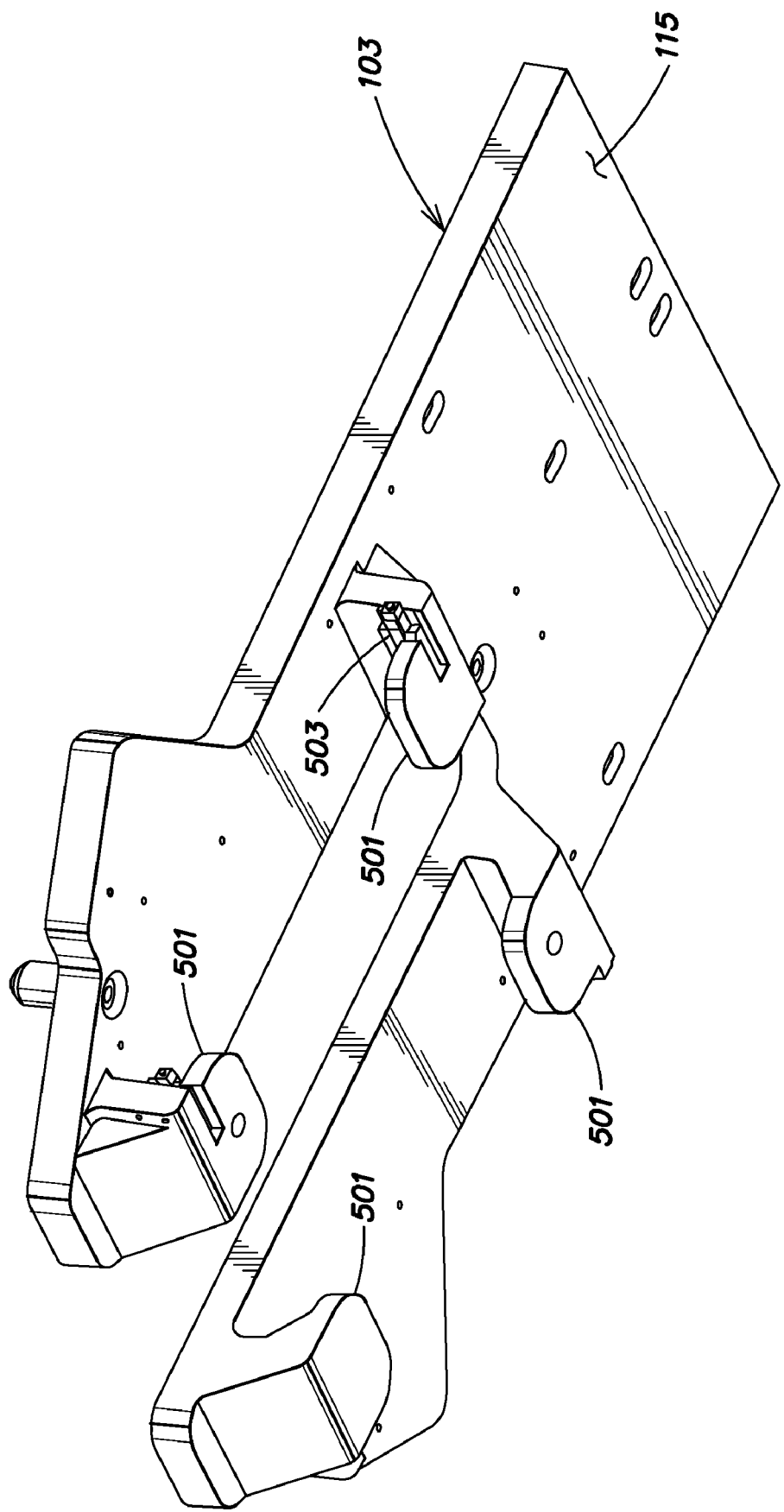
FIG. 5A is an isometric view of the bottom surface of the end effector of FIG. 1 in accordance with an embodiment of the present invention.

FIG. 5A is an isometric view of the bottom surface 115 of the end effector 103 in accordance with an embodiment of the present invention. The bottom side 115 of the end effector 103 may include one or more end effector flanges 501. As stated above, the bottom side 115 of the end effector 103 may support the FOUP 101 using the top side 109 of the FOUP 101. More specifically, the one or more end effector flanges 501 are adapted to couple to the OHT flange 107, for example, by sliding beneath the OHT flange 107. In this manner, the end effector 103 supports the FOUP 101 using the OHT flange 107. In one embodiment, the end effector 103 includes four end effector flanges 501. Other numbers of end effector flanges 501 may be employed. Further, different embodiments may include end effector flanges 501 of different shapes, positions and/or sizes. In one embodiment, one or more of the end effector flanges may include and/or be coupled to an end effector sensor 503 for ensuring proper alignment of the end effector flanges 501 with the OHT flange 107. For example, the end effector sensor 503 may indicate when the one or more end effector flanges 501 are properly positioned relative to the OHT flange 107.

Figure 5B:
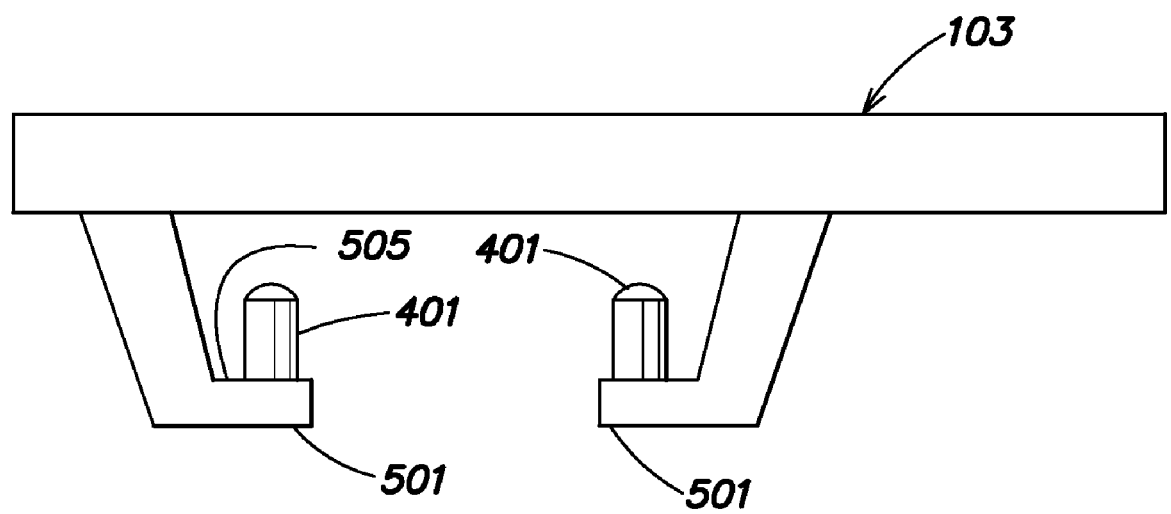
FIG. 5B is a side view of the end effector of FIG. 1 in accordance with an embodiment of the present invention.

FIG. 5B is a side view of the end effector 103 in accordance with an embodiment of the present invention. With reference to FIG. 5B, a top surface 505 of one or more of the end effector flanges 501 may include one or more end effector pins 401. The one or more end effector pins 401 on the top surface 505 of the end effector flanges 501 couple to (e.g., are inserted in) corresponding OHT flange slots (not shown) included in a bottom surface (not shown) of the OHT flange 107 when the end effector 103 supports the FOUP 101 by the OHT flange 107. The OHT flange slots and the one or more end effector pins 401 on the top surface 505 of the end effector flanges 501 are designed such that coupling the one or more end effector pins 401 with corresponding OHT flange slots aligns the FOUP 101 with the end effector 103.

Exemplary operation of the substrate carrier transferring system 409 (FIG. 4) is now described with reference to FIGS. 1-6 and with reference to FIGS. 7-17, which illustrate an exemplary method 601 for repositioning support provided by an end effector 101 in accordance with an embodiment of the present invention. More specifically, an exemplary method for repositioning support provided by the end effector 103 to a substrate carrier (e.g., FOUP 101) from a first side to a second side of the FOUP 101 is described. One or more of the steps of method 601 may, for example, be implemented via computer program code executed by the controller 407 and stored in a memory in, coupled to or otherwise associated with the controller 407 such as in any suitable computer readable medium (e.g., a carrier wave signal, a floppy disc, a compact disc, a DVD, a hard drive, a random access memory, etc.).

Figure 6:
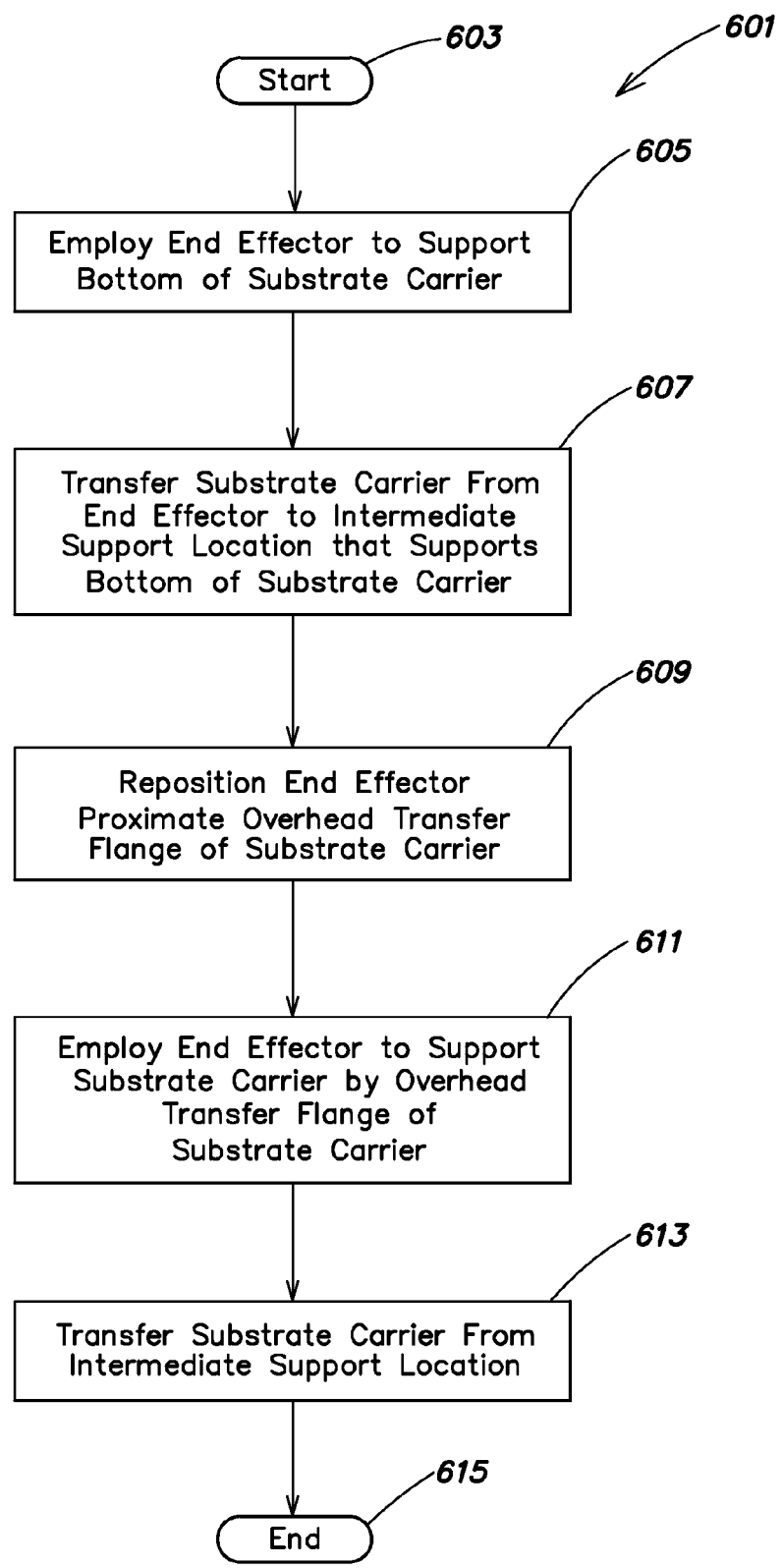
FIG. 6 illustrates an exemplary method for repositioning support provided by an end effector in accordance with an embodiment of the present invention.
Figure 7:
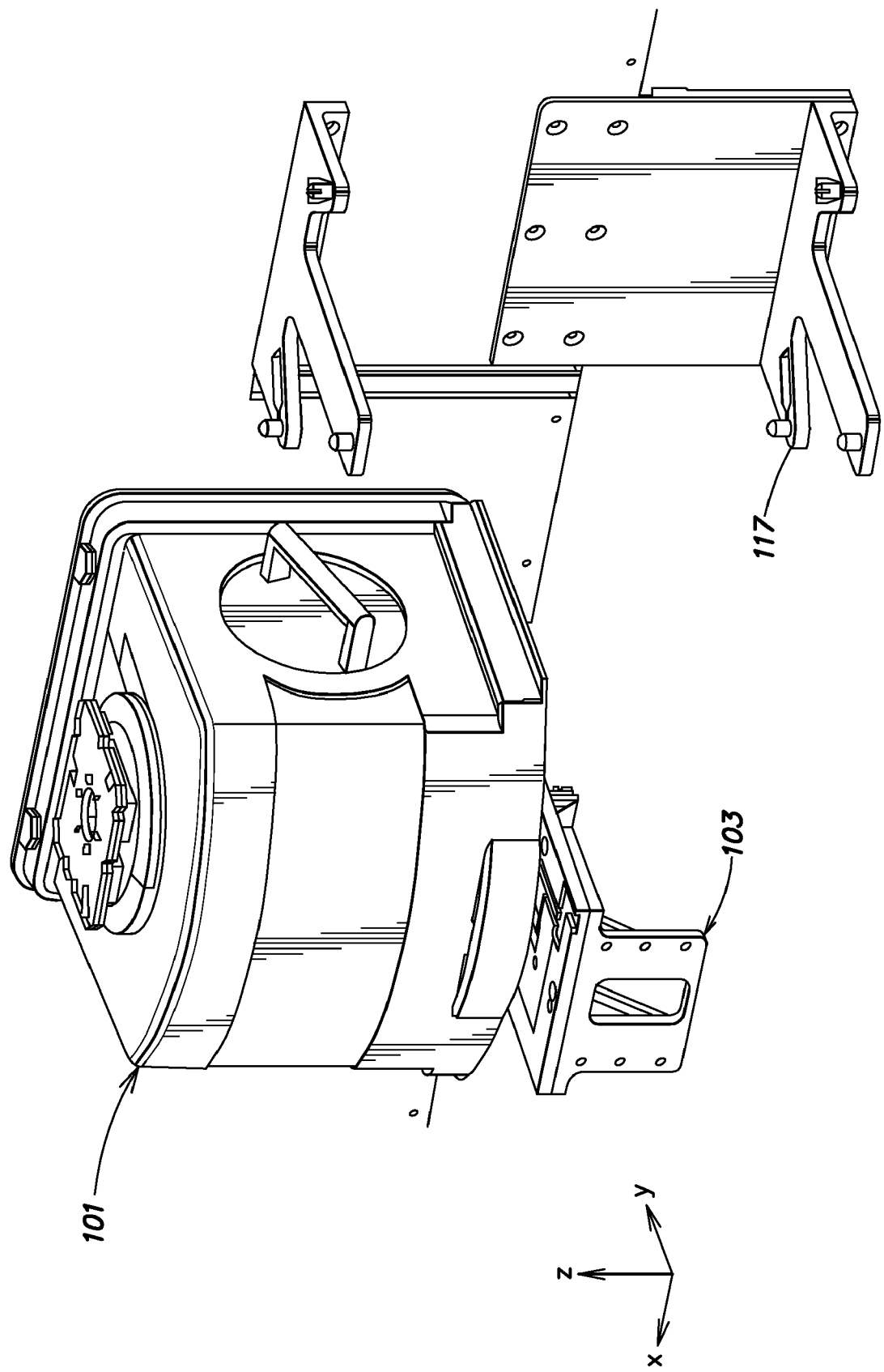
FIG. 7 illustrates an end effector employed to support a substrate carrier by a bottom of the substrate carrier (e.g., FOUP) in accordance with an embodiment of the present invention.

With reference to FIG. 6, in step 603, the method 601 begins. In step 605, an end effector 103 is employed to support a substrate carrier by a bottom side 301 of a substrate carrier (e.g., FOUP 101). The controller 407 may be employed to move the end effector such that the end effector pins 401 of the top surface 113 of the end effector 103 couple to the FOUP slots 303 included in the bottom surface 301 of the FOUP 101 thereby coupling the top surface 113 of the end effector 103 to the bottom side 301 of the FOUP 101. In this manner, the end effector 103 supports the bottom side 301 of the FOUP 101. The controller 407 may be employed to move the end effector 103 along one or more of the x, y and z axes to couple the end effector 103 to the FOUP 101 as described above. FIG. 7 illustrates an end effector 103 employed to support a substrate carrier by a bottom of the substrate carrier (e.g., FOUP 101) in accordance with an embodiment of the present invention. For example, the end effector 103 may have removed the FOUP 101 from another support shelf that supports the FOUP 101 via the bottom thereof, or from an overhead conveyor system that supports the FOUP via the OHT flange thereof. As shown in FIG. 7, the FOUP 101 is fully supported by the end effector 103.

In step 607, the substrate carrier (e.g., FOUP 101) is transferred from the end effector 101 to an intermediate support location 117. The intermediate support location 117 supports the bottom 301 of the substrate carrier (e.g., FOUP 101). For example, the controller 407 may move the end effector 103, while the end effector is supporting a bottom side 301 of the FOUP 101, along the z-axis (e.g., vertically upward or downward) such that the end effector is proximate (e.g., slightly higher) than the intermediate support location 117 (as shown in FIG. 7).

Figure 8:
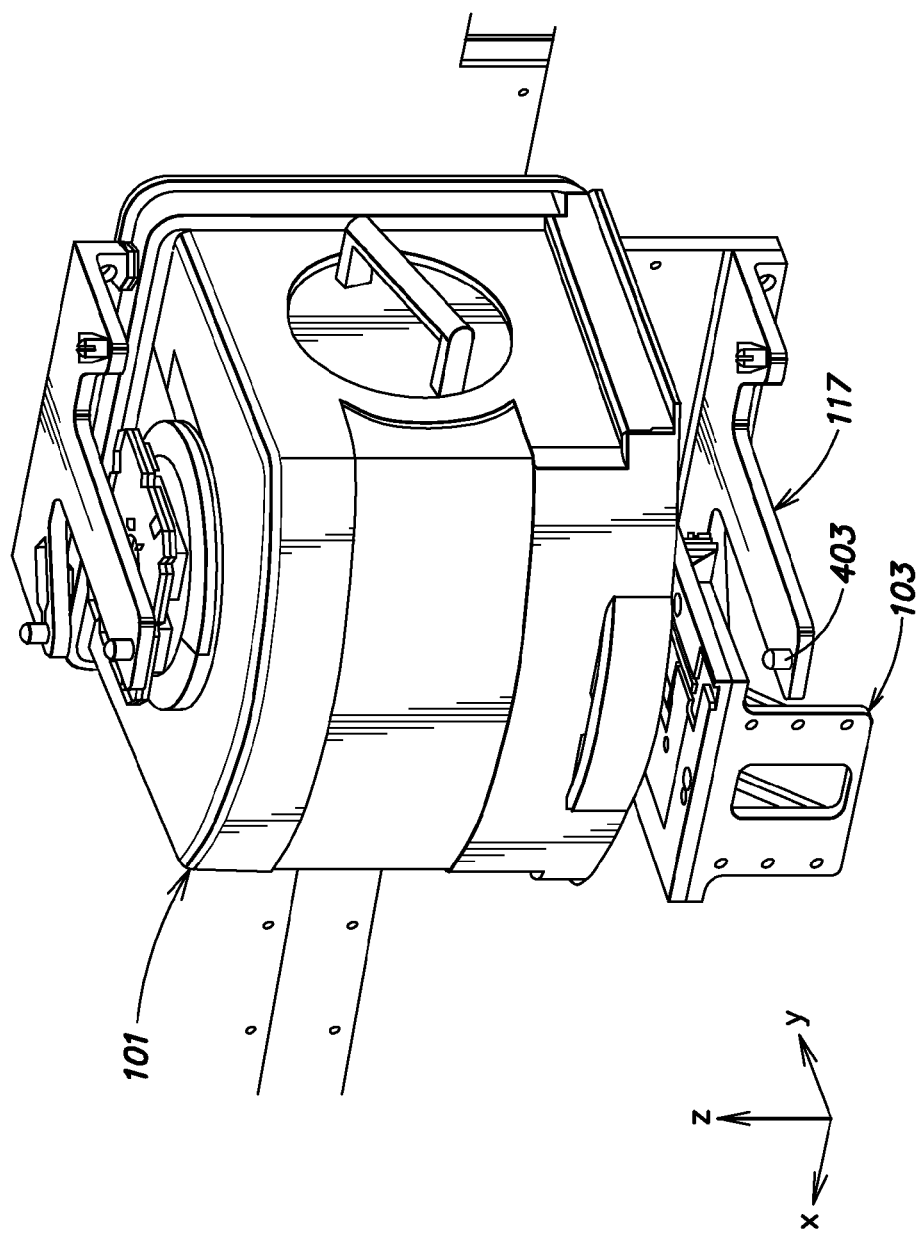
FIG. 8 illustrates the end effector of FIG. 7 directly above the intermediate support location in accordance with an embodiment of the present invention.

The controller 407 then moves the end effector 103, while the end effector 103 is supporting the bottom side 301 of the FOUP 101, along the x-axis (e.g., horizontally left or right) such that the end effector 103 is directly above the intermediate support location 117. FIG. 8 illustrates the end effector 103 of FIG. 7 directly above the intermediate support location 117 in accordance with an embodiment of the present invention. The end effector 103 fully supports the FOUP 101 by the bottom side 301 of the FOUP 101.

The controller 407 then moves the end effector 103, while the end effector 103 is supporting the bottom side 301 of the FOUP 101, along the z-axis (e.g., vertically downward). While the end effector 103 moves downward along the z-axis, the end effector 103 fully supports the bottom side 301 of the FOUP 101. However, as the end effector 103 approaches the position shown in FIG. 9 (e.g., the position where the end effector 103 and the intermediate support location 117 are in the same xy-plane or where the xy-plane of the end effector 103 is slightly higher or lower than the xy-plane of the intermediate support location 117, depending on the relative height of the pins 401, 403), the end effector 103 and the intermediate support location 117 may both support the bottom side 301 of the FOUP 101. For example, each of the end effector pins 401 of the end effector 103 and each corresponding support location pin 403 of the intermediate support location 117 may couple to (e.g., insert into) a respective FOUP slot 303 supporting the bottom side 301 of the FOUP 101. The amount of time that both the end effector 103 and the intermediate support location 117 support the bottom side 301 of the FOUP 101 may be brief (e.g., one second or less). FIG. 9 illustrates the intermediate support location 117 employed to support the bottom side 301 of the FOUP 101 in accordance with an embodiment of the present invention.

Figure 10:
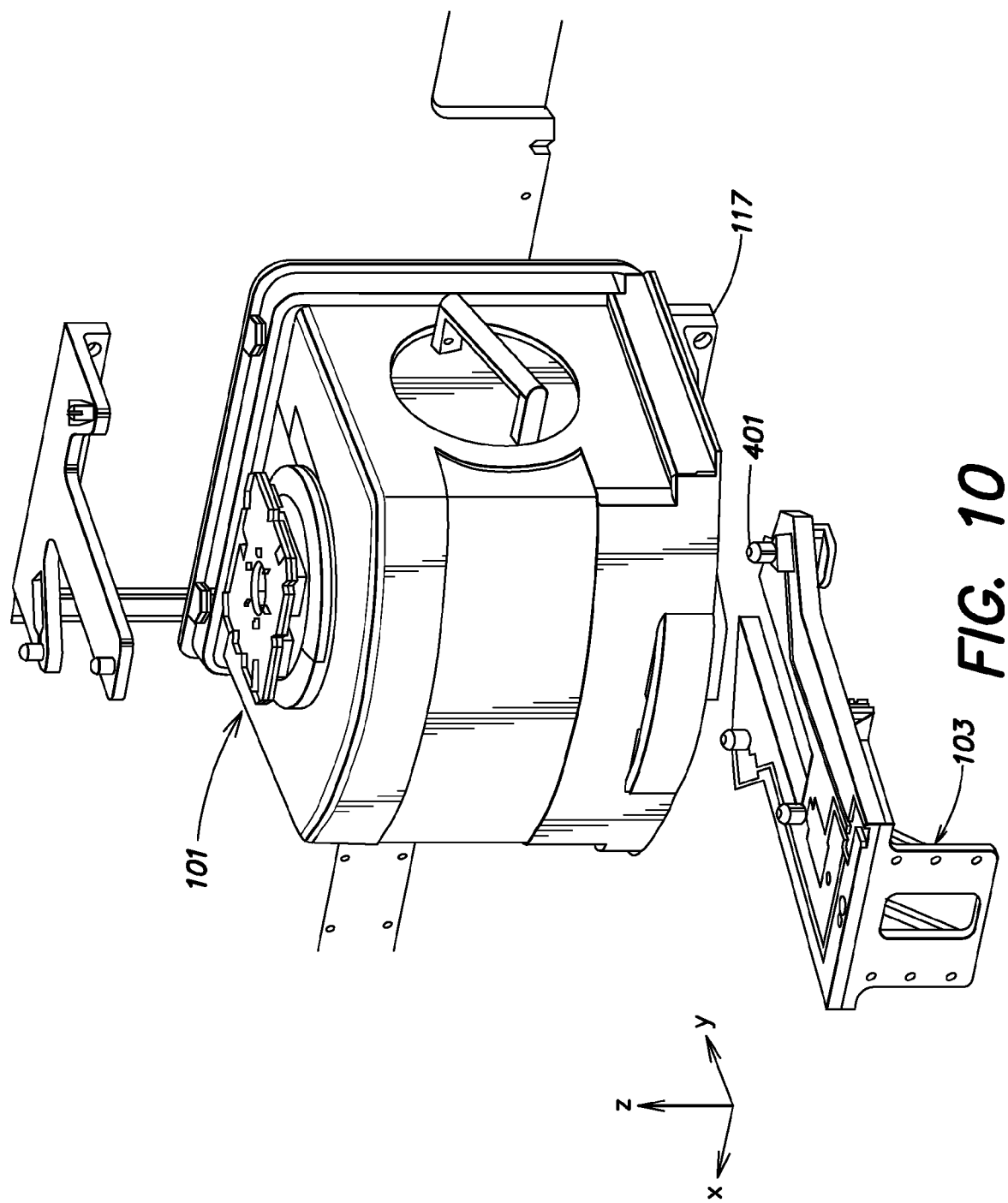
FIG. 10 illustrates the end effector of FIG. 7 positioned directly below the intermediate support location while the intermediate support location supports the FOUP in accordance with an embodiment of the invention.

As the controller 407 continues to move the end effector 103 vertically downward, the FOUP 101 continues to be supported from the bottom side 301 by the intermediate support location 117, and the end effector pins 401 disengage from the FOUP slots 303. Therefore, the end effector 103 no longer supports the FOUP 101 and the intermediate support location 117 may fully support the FOUP 101 by the bottom (e.g., bottom side) of the FOUP 101. Thus, the FOUP 101 is successfully transferred from the end effector 103 to the intermediate support location 117 (as shown in FIG. 10).

In step 609, the end effector 103 is repositioned proximate an overhead transfer (OHT) flange 107 of the substrate carrier (e.g., FOUP 101). The controller 407 is employed for moving the end effector 103, which is not supporting the FOUP 101, along one or more of the x, y, and z axes to reposition the end effector 103 proximate the OHT flange 107. For example, the controller 407 may move the end effector 103 vertically downward after the FOUP 101 is transferred from the end effector 103 to the intermediate support location 117. Such vertically downward movement may be continuous with the vertically downward movement of step 607 or separate movements may be used. As a result of the vertically downward movement, the end effector 103 is directly below the intermediate support location 117 while the intermediate support location 117 supports the FOUP 101. FIG. 10 illustrates the end effector 103 positioned directly below the intermediate support location 117 while the intermediate support location 117 supports the FOUP 101 in accordance with an embodiment of the invention. The end effector 103 is far enough below the bottom surface 301 of the FOUP 101 such that the end effector pins 401 do not contact the intermediate support location 117 during any horizontal movement of the end effector 103 (a smaller or larger vertical distance than that shown in FIG. 10 may be used, as may be a combination of vertical and horizontal movements).

Figure 11:
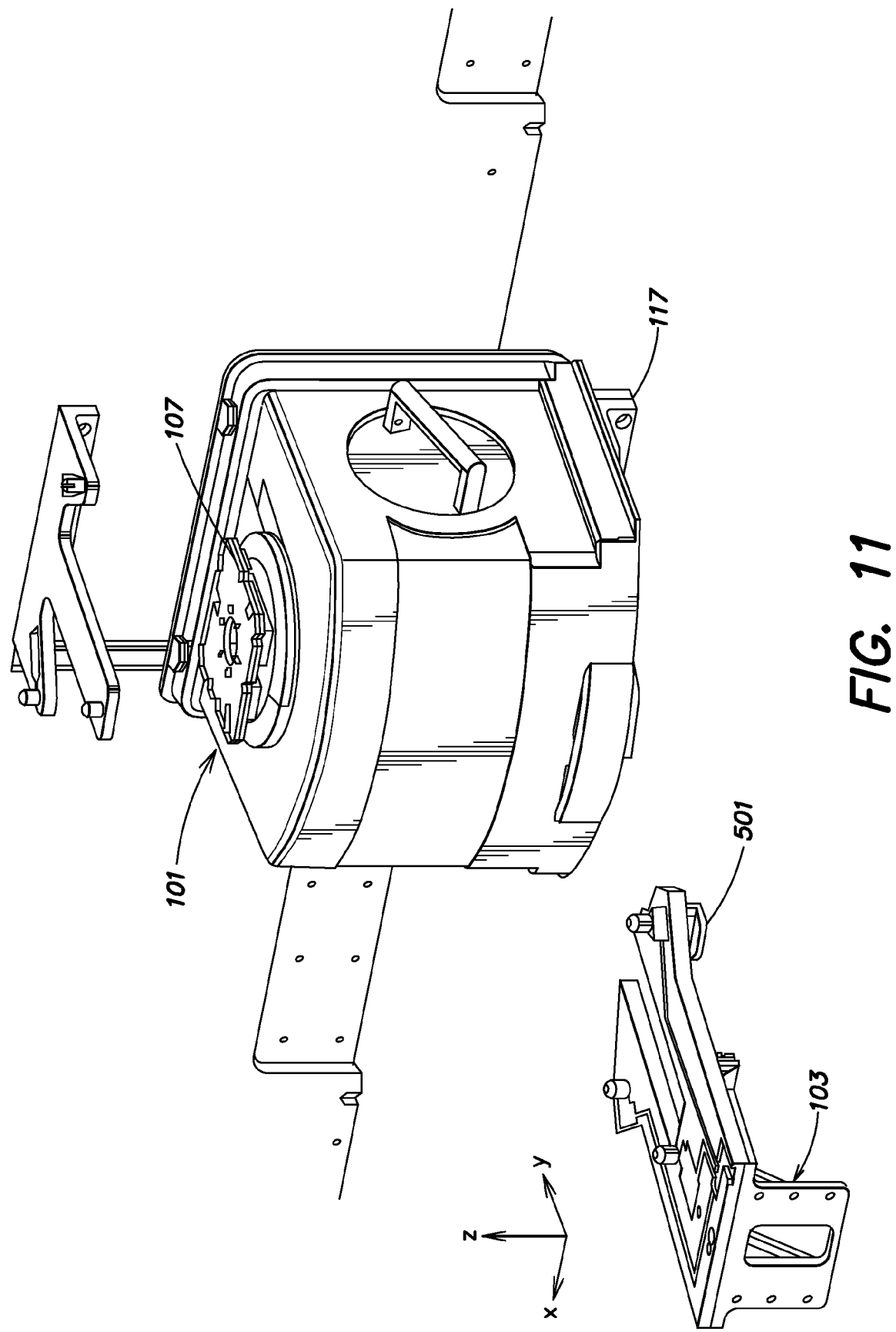
FIG. 11 illustrates the end effector of FIG. 7 positioned below the FOUP supported by the intermediate support location such that no portion of the end effector is underneath the FOUP in accordance with an embodiment of the present invention.

The controller 407 may then move the end effector 103 horizontally, for example, along the x-axis. The controller 407 moves the end effector 103, for example into an open region or tunnel (see, for example, open region 1911 in FIG. 19), such that no portion of the end effector 103 is underneath the FOUP 101, which is supported by the intermediate support location 117. The tunnel defines an area in which the end effector may be moved along the z-axis (e.g., vertically), for example, without contacting other equipment or apparatus employed during the semiconductor device manufacturing process. For example, the tunnel may be a path between columns of shelves and/or load ports of a processing tool. FIG. 11 illustrates the end effector 103 positioned below the FOUP 101 supported by the intermediate support location 111 such that no portion of the end effector 103 is underneath the FOUP 101 in accordance with an embodiment of the present invention.

Figure 12:
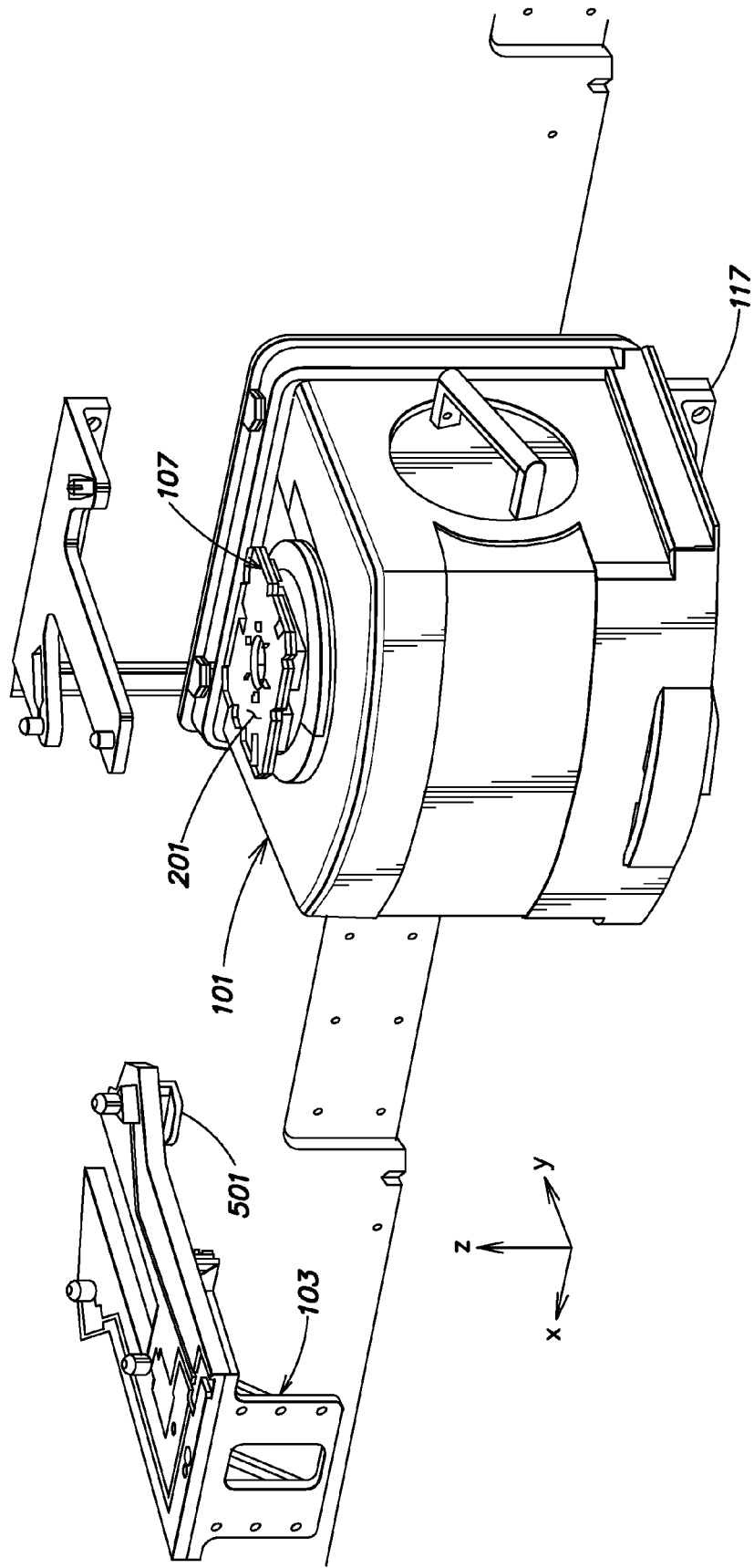
FIG. 12 illustrates the end effector of FIG. 7 positioned slightly higher than the FOUP in accordance with an embodiment of the present invention.

The controller 407 then moves the end effector 103 along the z-axis (e.g., vertically in the tunnel) such that the end effector 103 is slightly higher than the FOUP 101. More specifically, the end effector 103 is moved such that the bottom side 115 of the end effector 103 is higher (e.g., vertically) than the top surface of the FOUP's OHT flange 107 and such that the end effector flanges 501 of the end effector 103 and any raised features (such as the vertically oriented kinematic pins 401 shown in the side elevational view of FIG. 5B) are lower (e.g., vertically) than the OHT flange 107. Because the end effector 103 is moving in an open region, the end effector 103 will not contact other equipment or apparatus employed during the semiconductor device manufacturing process. FIG. 12 illustrates the end effector 103 positioned slightly higher than the FOUP 101, as described above, in accordance with an embodiment of the present invention.

Figure 13:
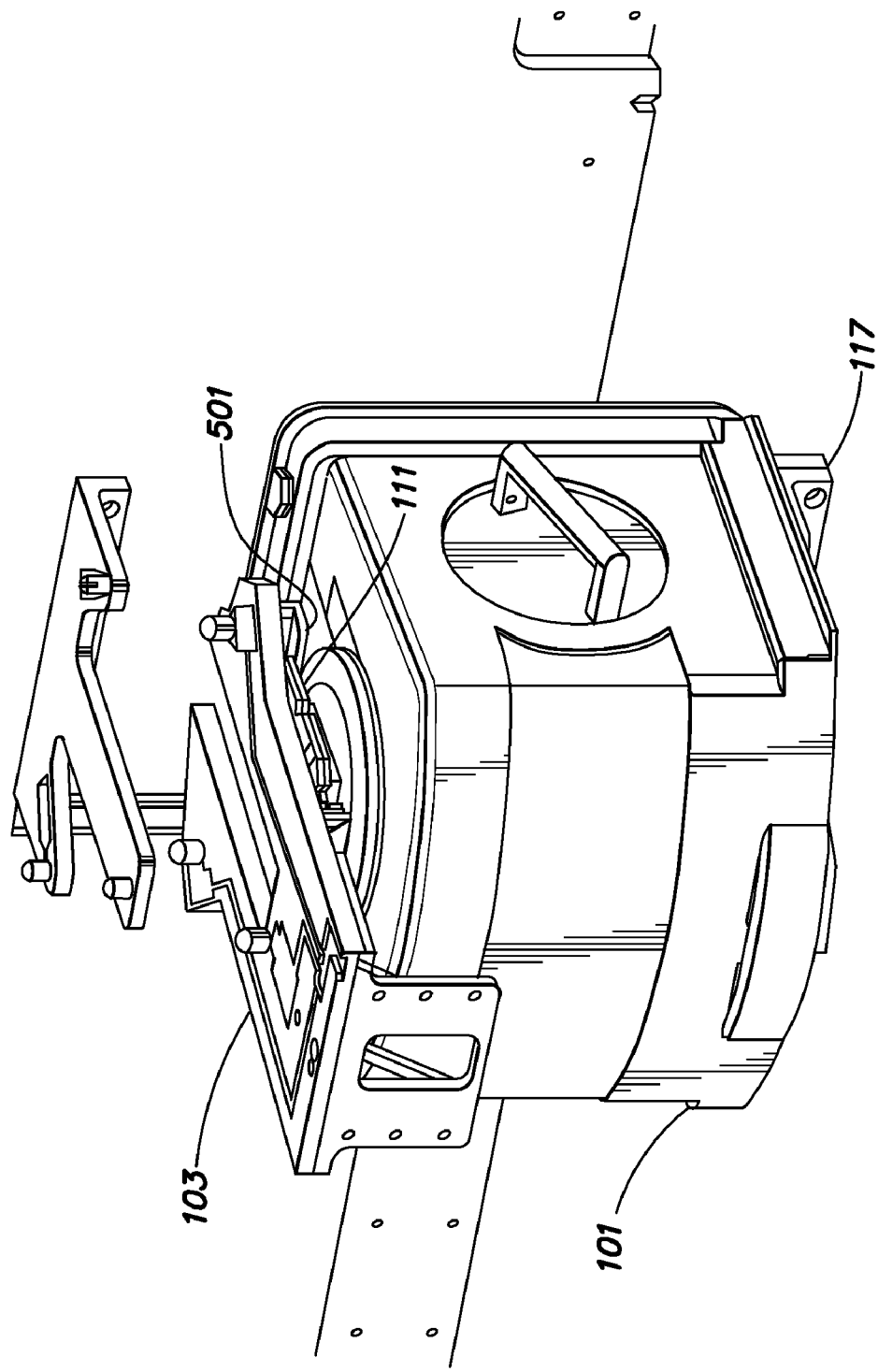
FIG. 13 illustrates the end effector of FIG. 7 positioned proximate the FOUP in accordance with an embodiment of the present invention.

The controller 407 moves the end effector 103 horizontally (e.g., along the x and/or y axes) such that the bottom side 115 of the end effector 103 is directly above the top surface 201 of the OHT flange 107 and the end effector flanges 501 are directly below the OHT flange 107. If the end effector 103 is moved upward along the z-axis, the end effector flanges 501 will couple to the OHT flange 107 (e.g., via kinematic pins 401 that provide final alignment between the end effector 103 and the FOUP 101 and that prevent the FOUP 101 from sliding during movement in the X-direction). In this manner, the end effector 103 is repositioned proximate the OHT flange 107 of the FOUP 101. FIG. 13 illustrates the end effector 103 positioned proximate the FOUP 101, as described above, in accordance with an embodiment of the present invention.

Figure 14:
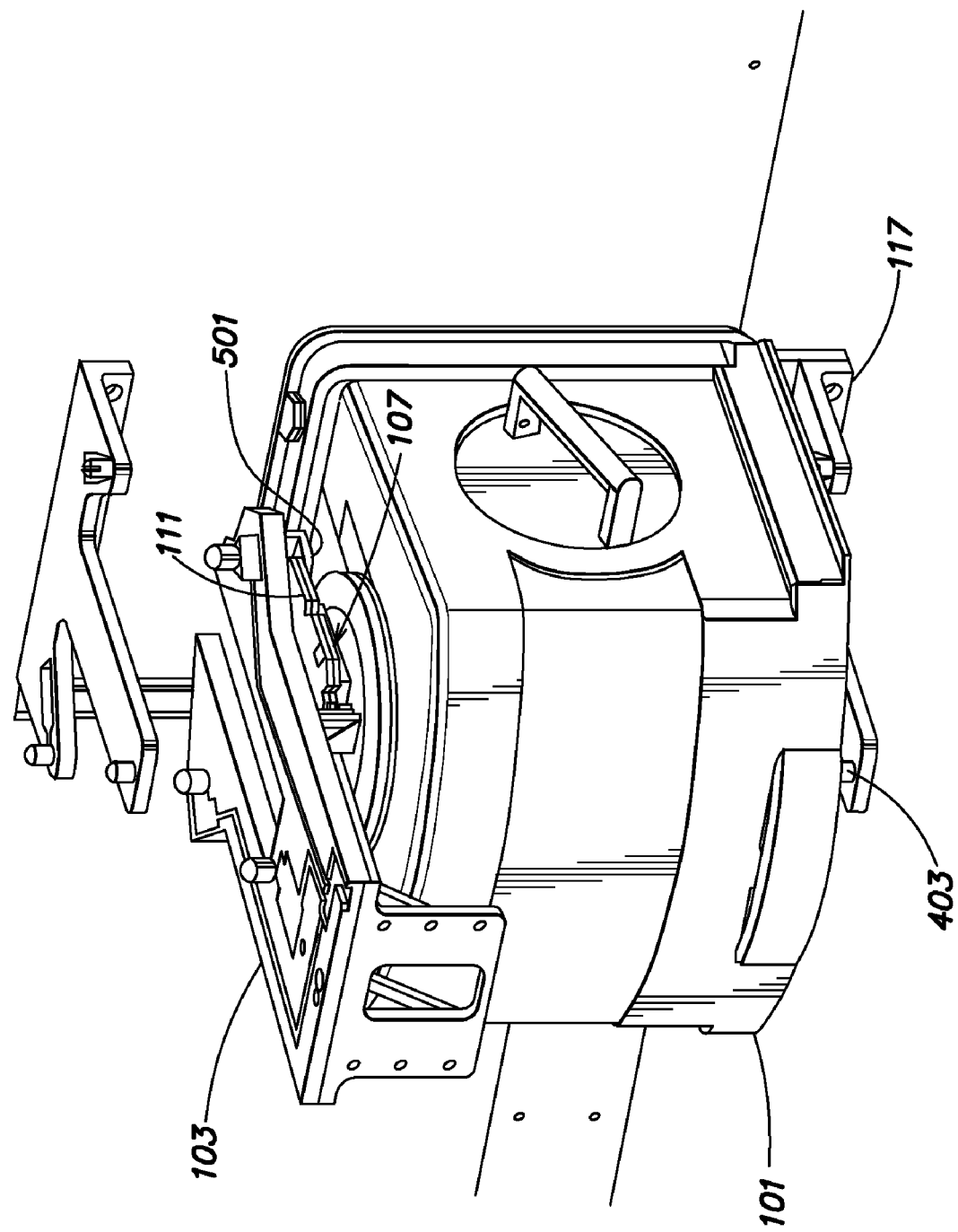
FIG. 14 illustrates the end effector of FIG. 7 supporting the FOUP by an OHT flange of the FOUP in accordance with an embodiment of the present invention.

In step 611, the end effector 103 is employed to support the substrate carrier (e.g., FOUP 101) by the OHT flange 107 of the substrate carrier (e.g., FOUP 101). The controller 407 moves the end effector 103 upward along the z-axis (e.g., vertically). While the end effector 103 is moved upward along the z-axis, the end effector flanges 501 couple to and support the OHT flange 107. As a result of the upward movement of the end effector 103, the FOUP 101 is lifted upward along the z-axis from the intermediate support location 117. Consequently the support location pins 403 of the support location 117 disengage from corresponding FOUP slots 303. Therefore, the end effector 103 fully supports the FOUP 101 by the OHT flange 107 of the FOUP 101. FIG. 14 illustrates the end effector 103 supporting the FOUP 101 by the OHT flange 107 of the FOUP 101 in accordance with an embodiment of the present invention.

Figure 15:
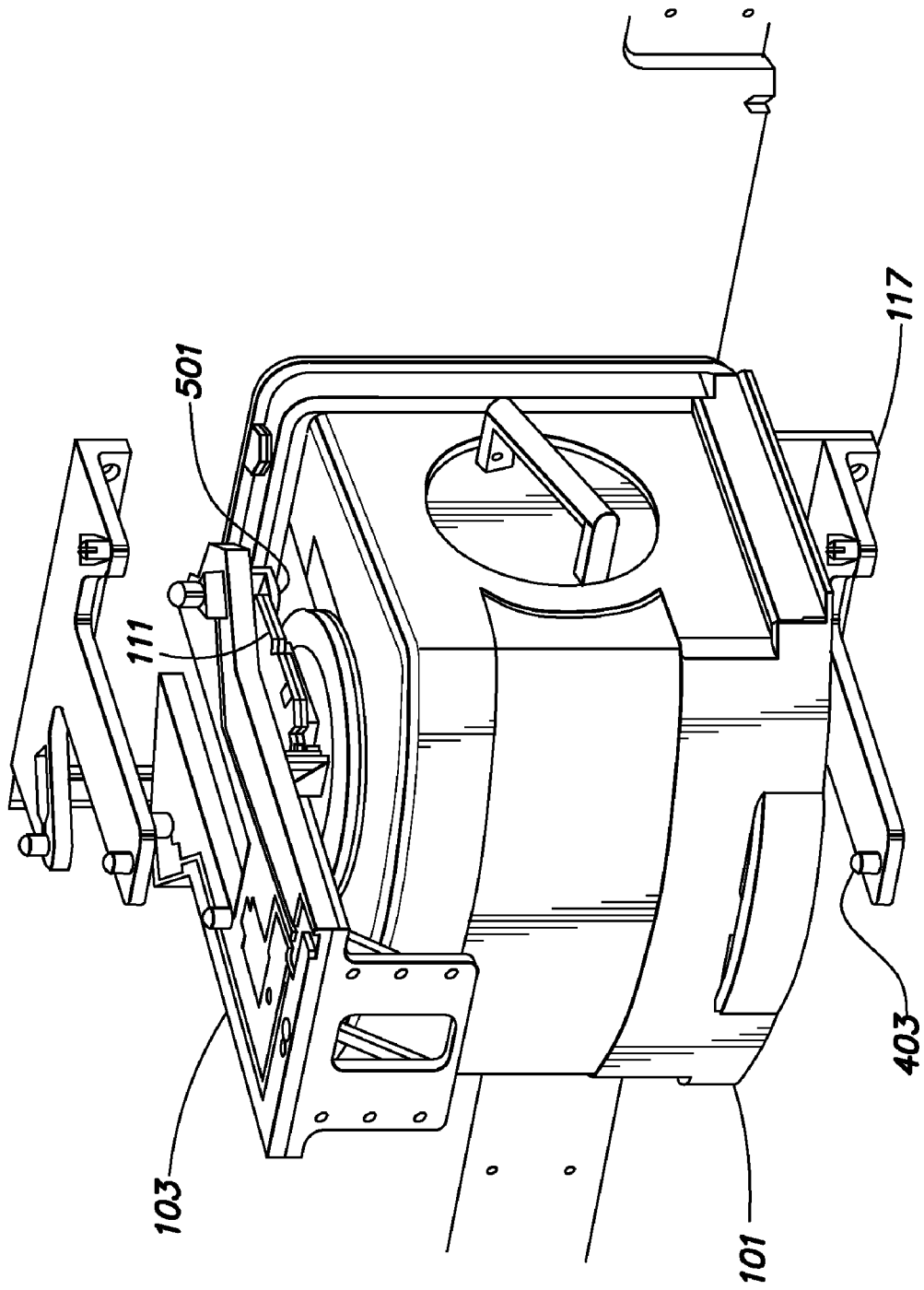
FIG. 15 illustrates the end effector of FIG. 7 supporting the FOUP directly above the intermediate support location in accordance with an embodiment of the present invention.

In step 613, after the end effector 103 supports the substrate carrier by its OHT flange, the substrate carrier, (e.g., FOUP 101) is transferred from the intermediate support location 117. For example, the FOUP 101 may be placed into a processing or load lock chamber (not shown). The end effector 103 is moved, and therefore the FOUP 101 is lifted upward along the z-axis such that the support location 117 pins do not contact the bottom side 301 of the FOUP 101 during any horizontal movement of the end effector 103 and the FOUP 101. Thus, the end effector 101 supports the FOUP 101 directly above the intermediate support location 117, as shown in FIG. 15.

Figure 16:
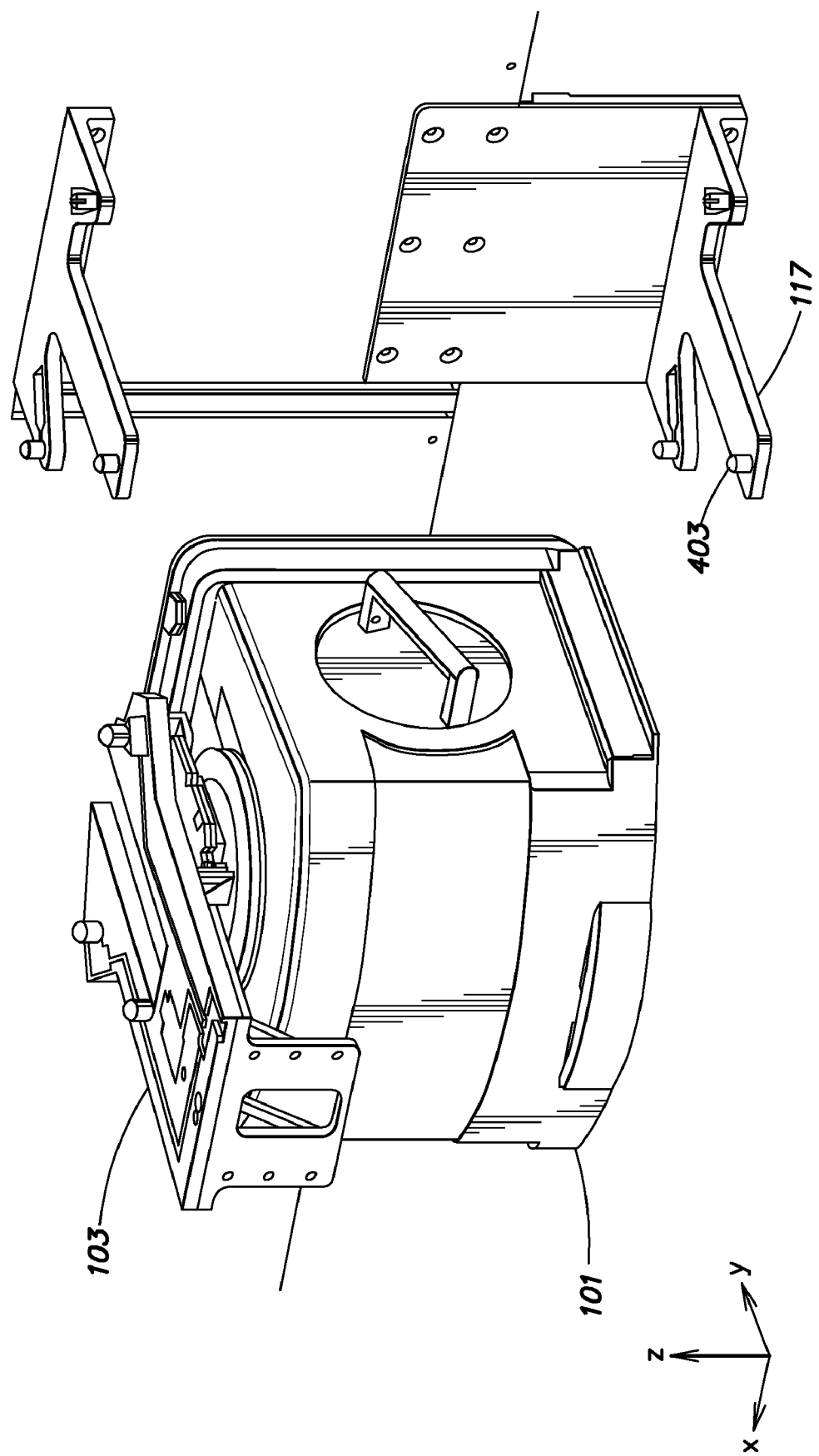
FIG. 16 illustrates the end effector and the FOUP of FIG. 7 positioned higher than the intermediate support location and such that no portion of the end effector and the FOUP is over the intermediate support location in accordance with an embodiment of the present invention.

The controller 407 moves the end effector 103 horizontally (e.g., along the x and/or y axes), for example into the open region or tunnel, such that no portion of the end effector 103 and the FOUP 101, which is supported by the end effector 103, is over (e.g., extends above) the intermediate support location 117. FIG. 16 illustrates the end effector 103 and the FOUP 101 positioned higher than the intermediate support location 117 and such that no portion of the end effector 103 and the FOUP 101 is over the intermediate support location 117 in accordance with an embodiment of the present invention.

Figure 17:
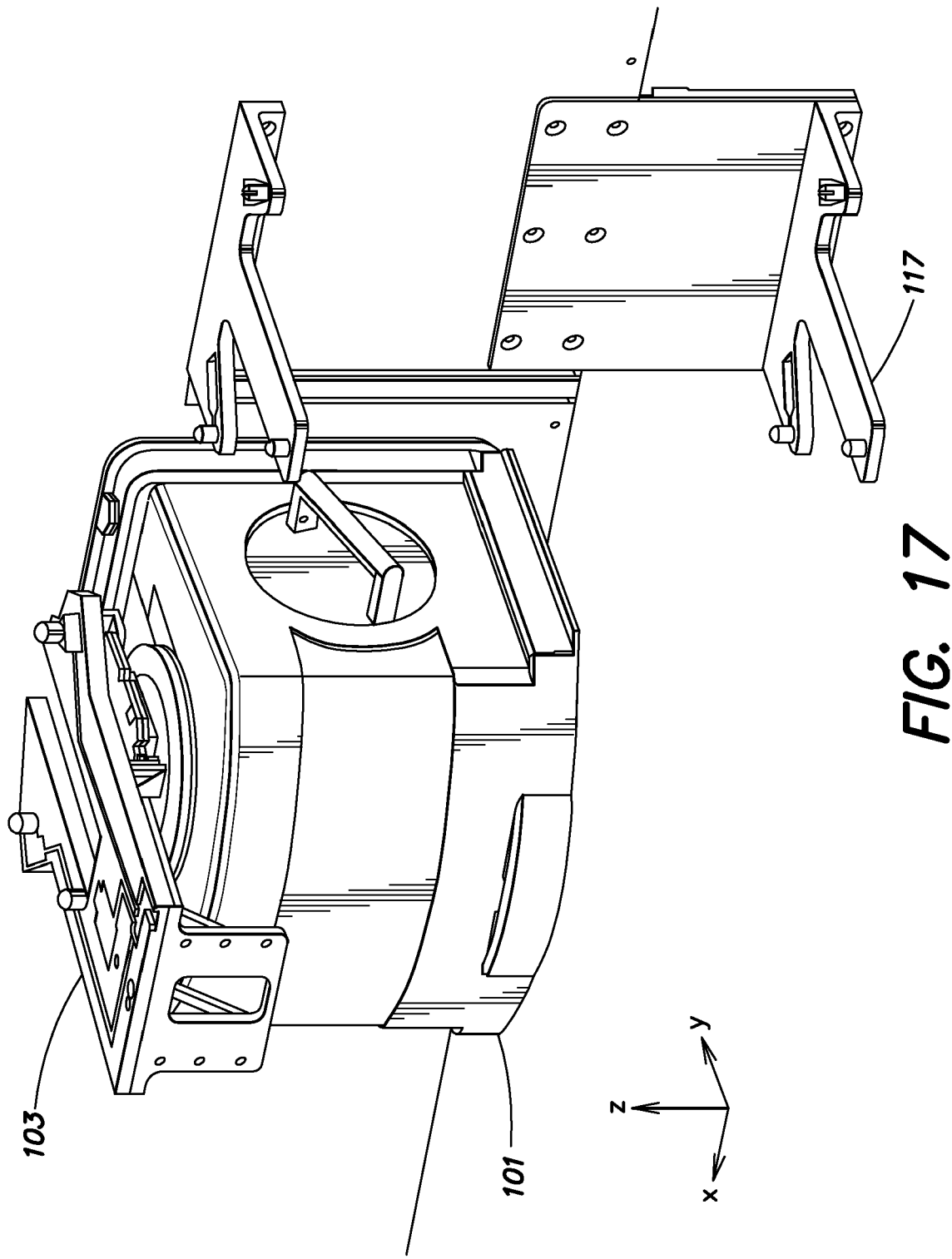
FIG. 17 illustrates the end effector and the FOUP of FIG. 7 transferred from the intermediate support location in accordance with an embodiment of the present invention.

The controller 407 moves the end effector 103 and the FOUP 101 supported by the end effector 103, along the z-axis (e.g., vertically) to position the FOUP 101 relative to another component, such as a load lock chamber (not shown), docking station of a processing tool, or the like, included in the semiconductor device manufacturing facility. The controller 407 may move the end effector 103 and the FOUP 101 horizontally (e.g., along the x and/or y axis) to position the FOUP 101 relative to the component. In this manner, the FOUP 101 is transferred from the intermediate support location 117. FIG. 17 illustrates the end effector and the FOUP transferred from the intermediate support location 117 (e.g., and being transported to any other desired location such as a load lock chamber, a docking station of a processing tool, another support location, a storage shelf, a conveyer system, etc.) in accordance with an embodiment of the present invention.

In step 615, the method 601 ends. Through the use of the method 601 of FIG. 6, support provided by an end effector 103 is repositioned. More specifically, the support provided by the end effector 103 to a substrate carrier (e.g., FOUP 101) may be repositioned from a first end (e.g., bottom side 301) of the FOUP 101 to a second end (e.g., a top side 109) of the FOUP 101 while the FOUP 101 is transferred from a first location to a second location in the semiconductor device manufacturing facility. The present method is advantageous when the FOUP 101 is more conveniently transferred from the first location using the first end of the FOUP 101 and more conveniently transferred to the second location using the second end of the FOUP 101.

In one particular embodiment, the method 601 may be used as part of an operation to transfer a substrate carrier from an overhead conveyor system that supports substrate carriers via an overhead transfer flange, to a load port of a processing tool that supports substrate carriers via a bottom side of the substrate carriers. For example, the end effector 103 may be used to remove a substrate carrier from an overhead conveyor system as described in previously incorporated U.S. patent application Ser. Nos. 10/650,310 and 10/650,480, both filed Aug. 28, 2003 (e.g., while the conveyor system is in motion), by supporting the substrate carrier via a bottom of the substrate carrier. The end effector 103 then may be repositioned so that the end effector 103 supports the substrate carrier via the OHT flange of the substrate carrier (as described by method 601). The substrate carrier then may be positioned (lowered) onto a load port of a processing tool and docked/opened to allow processing of the substrates contained within the substrate carrier. The reverse operation may be performed to remove the substrate carrier from the load port by supporting the substrate carrier via its OHT flange, and loading the substrate carrier back onto the overhead conveyor system by supporting the substrate carrier via its bottom side.

Further exemplary operation of the substrate carrier transferring system 409 is now described with reference to FIGS. 7-17, and with reference to FIG. 18, which illustrates a second exemplary method 1801 for repositioning support provided by an end effector 103 in accordance with an embodiment of the present invention. More specifically, an exemplary method for repositioning support provided by the end effector 103 to a substrate carrier (e.g., FOUP 101) from a top side 109 (e.g., a second side) to a bottom side 301 (e.g., a first side) of the FOUP 101 is described. One or more of the steps of method 1801 may, for example, be implemented via computer program code executed by the controller 407 and stored in a memory in, coupled to or otherwise associated with the controller 407, such as in any suitable computer readable medium (e.g., a carrier wave signal, a floppy disc, a compact disc, a DVD, a hard drive, a random access memory, etc.).

Figure 18:
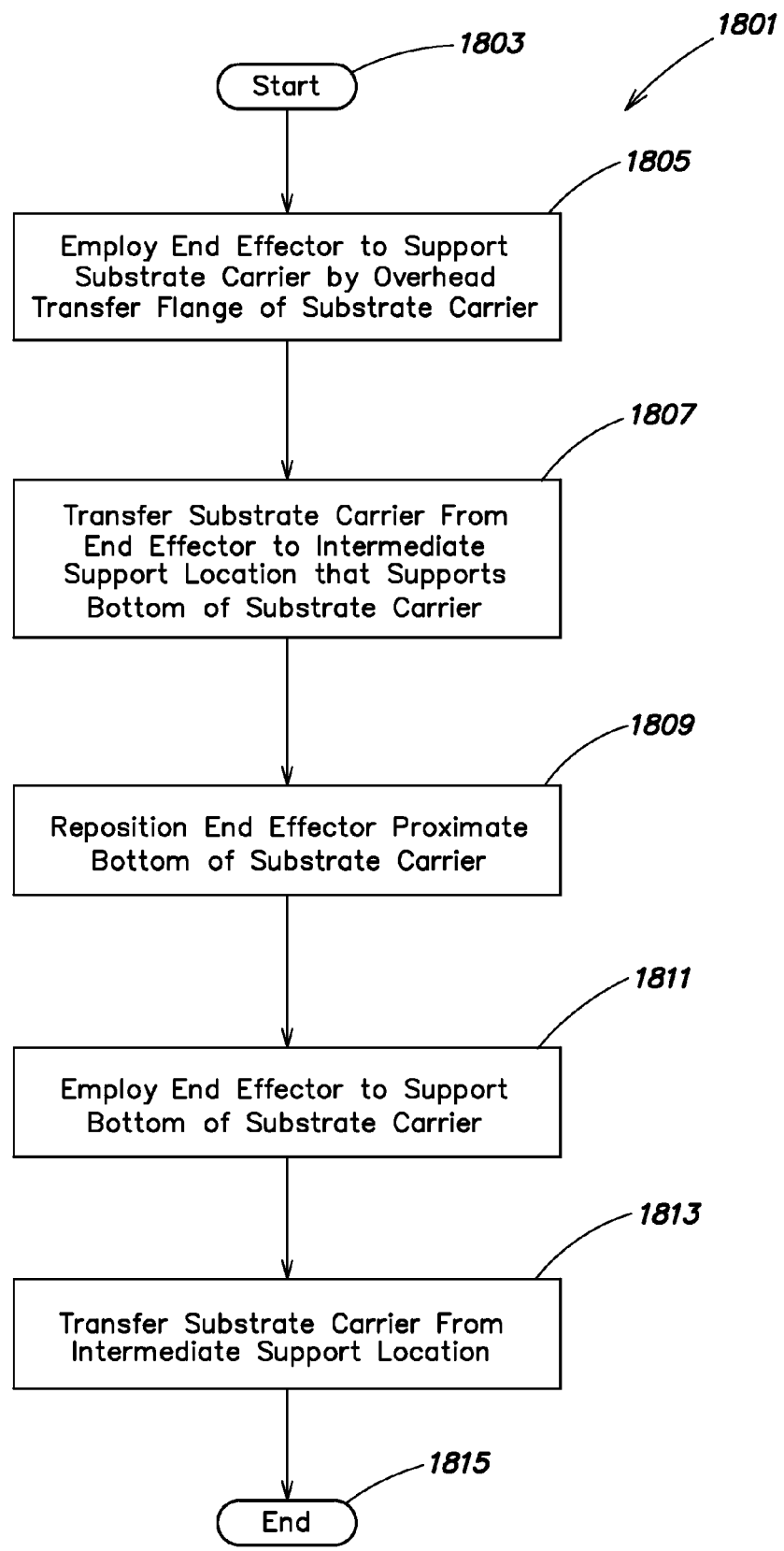
FIG. 18 illustrates a second exemplary method for repositioning support provided by an end effector in accordance with an embodiment of the present invention.

With reference to FIG. 18, in step 1803, the method 1801 begins. In step 1805, an end effector 103 is employed to support a substrate carrier (e.g., FOUP 101) by an overhead transfer (OHT) flange 107 of the substrate carrier (e.g., FOUP 101). As described above, the end effector flanges 501 may couple to and support the OHT flange 107. Consequently, as shown in FIG. 17, the end effector 103 supports the FOUP 101 by the OHT flange 107 of the FOUP 101. For example, the end effector 103 supports the FOUP 101 using the OHT flange 107 while transferring the FOUP 101 from a first location (e.g., a load lock chamber or docking station) of the semiconductor device manufacturing facility.

In step 1807, the substrate carrier (e.g., FOUP 101) is transferred from the end effector 103 to an intermediate support location 117. The intermediate support location supports the bottom side 301 of the FOUP 101. The controller 407 may be employed for moving the end effector 103 along one or more of the x, y and z axes such that the FOUP 101 is transferred from the end effector 103 to the intermediate support location 117. For example, the controller 407 may move the end effector 103 and therefore, the FOUP 101, along the z-axis such that the FOUP 101 is proximate (e.g., slightly higher than) the intermediate support location 117. More specifically, the controller 407 positions the end effector 103 and the FOUP 101 such that the bottom side 301 of the FOUP 101 does not contact the support location pins 403 when the end effector 103 and the FOUP 101 are moved horizontally (e.g., along the x and/or y axes). As shown in FIG. 16, the end effector 103 and the FOUP 101 are positioned higher than the intermediate support location 117.

The controller 407 moves the end effector 103, and therefore the FOUP 101, horizontally (e.g., along the x and/or y axes) such that each FOUP slot 303 in the bottom side 301 of the FOUP 101 is positioned directly above a corresponding support location pin 403 of the intermediate support location 117. As shown in FIG. 15, the end effector 103 and the FOUP 101 are positioned directly above the intermediate support location 117.

The controller 407 moves the end effector 103, and therefore the FOUP 101, downward vertically (e.g., along the z-axis). When the bottom surface 301 of the FOUP 101 is positioned slightly higher than the intermediate support location 117, the support location pins 403 begin to enter the corresponding FOUP slots 303 in the bottom side 301 of the FOUP 101. As shown in FIG. 14, the FOUP 101 is positioned slightly higher than the intermediate support location 117.

The controller 407 moves the end effector 103 and the FOUP 101, downward vertically until the support location pins 403 engage or contact (e.g., couple to) the FOUP slots 303. As described above, the support location pins 403 may include sensors 405 for indicating when and/or determining whether one or more end effector pins 401 and/or the one or more support location pins 403 are properly positioned relative to the FOUP slots 303. When the support location pins 403 are properly positioned in (e.g., coupled to) the FOUP slots 303, the end effector flanges 501 are not coupled to the OHT flange 107. Consequently, the intermediate support location 117 fully supports the FOUP 101, and the end effector 103 does not support the FOUP 101. Therefore, the FOUP 101 is transferred from the end effector 103 to the intermediate support location 117. As shown in FIG. 13, the intermediate support location 117 supports the FOUP 101.

In step 1809, the end effector 103 is repositioned proximate the bottom of the substrate carrier (e.g., FOUP 101). The controller 407 may be employed for moving the end effector 103 along one or more of the x, y and z axes so as to reposition the end effector 103 proximate the bottom side 301 of the FOUP 101. For example, the controller 407 moves the end effector 103 horizontally along the x and/or y axes (e.g., into the tunnel) such that no portion of the end effector 103 is over (e.g., extends above) the FOUP 101, which is supported by the intermediate support location 117. As shown in FIG. 12, the end effector 103 is positioned such that no portion of the end effector 103 extends above the FOUP 101.

The controller 407 then moves the end effector 103 downward along the z-axis (e.g., vertically in the tunnel) such that the end effector 103 is lower than the intermediate support location 117. The end effector 103 is positioned such that the end effector pins 401 do not contact the intermediate support location 117 when the end effector 103 is moved horizontally (e.g., along the x and or y axes). As shown in FIG. 11, the end effector 103 is positioned lower than the intermediate support location 117, as described above.

The controller 407 then moves the end effector 103 horizontally (e.g., along the x and/or y axes) such that the end effector 103 is directly below the intermediate support location 117 and FOUP 101. More specifically, the end effector 103 is positioned such that the end effector 103 and the intermediate support location 117 may occupy the same plane (e.g., xy plane) when the end effector 103 is moved vertically, and the end effector pins 401 are positioned directly below corresponding FOUP slots 303 in the bottom side 301 of the FOUP 101. As shown in FIG. 10, the end effector 103 is positioned directly below the intermediate support location 117 and FOUP 101, as described above. In this manner, the end effector 103 is repositioned proximate the bottom side 301 of the FOUP 101.

In step 1811, the end effector 103 is employed to support the bottom of the substrate carrier (e.g., FOUP 101). The controller 407 moves the end effector 103 upward along the z-axis (e.g., vertically) such that the end effector pins 401 engage or couple to corresponding FOUP slots 303. The end effector 103 then supports the FOUP 101 as shown in FIG. 9. As mentioned above, the end effector 103 and the intermediate support location 117 may briefly support the FOUP 101 at the same time. During the upward movement of the end effector 103, the support location pins 403 disengage from the FOUP slots 303. Consequently, the end effector 103 supports the bottom side 303 of the FOUP 101; the intermediate support location 117 does not support the bottom side 303 of the FOUP 101.

In step 1813, the substrate carrier (e.g., FOUP 101) is transferred from the intermediate support location 117. The controller 407 may be employed for moving the end effector 103 along one or more of the x, y and z axes such that the FOUP 101 is transferred from the intermediate support location 117. For example, the controller 407 moves the end effector 103, which supports the bottom side 301 of the FOUP 101, upward along the z-axis (e.g., vertically) to a position directly above the intermediate support location. More specifically, the end effector 103 is positioned such that the end effector 103 does not contact the intermediate support location 117 when the end effector 103 is moved horizontally (e.g., along the x and/or y axes). As shown in FIG. 8, the end effector 103 and the FOUP 101 are positioned above the intermediate support location 117, as described above.

The controller 407 may move the end effector 103 horizontally (e.g., along the x and/or y axes) such that no portion of the end effector 103 and the FOUP 101 is over (e.g., extends above) the intermediate support location 117. For example, the end effector 103, and therefore the FOUP 103, are moved into the tunnel or open region. As shown in FIG. 7, the end effector 103 and the FOUP 101 are positioned such that no portion of the end effector 103 and the FOUP 101 is over the intermediate support location 117. The end effector 103, and therefore the FOUP 101, may be moved along the z-axis (e.g., vertically) such that the FOUP 101 is proximate a second location of the semiconductor device manufacturing facility (e.g., an overhead conveyor (not shown)). In this manner, the FOUP 101 is transferred from the intermediate support location 117.

In step 1815, the method 1801 ends. Through the use of the method 1801 of FIG. 18, support provided by an end effector 103 is repositioned. More specifically, the support provided by the end effector 103 to a substrate carrier (e.g., FOUP 101) may be repositioned from a top side 109 of the FOUP 101 to a bottom side 301 of the FOUP 101 while the FOUP 101 is transferred from a first location (e.g., a processing or load lock chamber) to a second location (e.g., an overhead conveyor) in the semiconductor device manufacturing facility. The present method is advantageous when the FOUP 101 is more conveniently transferred from the first location using the top side of the FOUP 101 and transferred more conveniently to the second location using the bottom side of the FOUP 101.

The present invention is particularly advantageous when employed in a system such as that described in previously incorporated U.S. patent application Ser. No. 10/650,480, filed Aug. 28, 2003 and titled "SUBSTRATE CARRIER HANDLER THAT UNLOADS SUBSTRATE CARRIERS DIRECTLY FROM A MOVING CONVEYOR,".

The foregoing description discloses only exemplary embodiments of the invention. Modifications of the above disclosed apparatus and methods which fall within the scope of the invention will be readily apparent to those of ordinary skill in the art. For instance, although exemplary sequences of movements for the end effector 103 were provided while describing one or more steps of the present methods 601, 1801, different sequences of movement may be employed to perform any of the steps of the present methods 601, 1801. In one or more embodiments, the controller 407 is adapted to perform one or more of the steps of the present methods 601, 1801. Alternatively, other control devices may be employed to perform one or more steps of the present methods 601, 1801. Although in one or more embodiments, the first end was a bottom side 301 of the FOUP 101 and the second end was the top side 109 of the FOUP 101, or vice versa, the first end may be any side of the FOUP 101 and the second end may be any other side of the FOUP 101.

Further, although the end effector 103 and/or intermediate support location 117 supports the bottom side 301 of the FOUP 101 by coupling pins 401, 403 to corresponding to (e.g., complementary to) slots 303, the end effector 103 and/or the intermediate support location 117 and the FOUP 101 may be coupled using different complementary devices. Similarly, the end effector flanges 501 and the OHT flange 107 may be replaced by other complementary devices. In some embodiments, the intermediate support locations 117 may support a substrate carrier by its overhead transfer flange.

Figure 19:
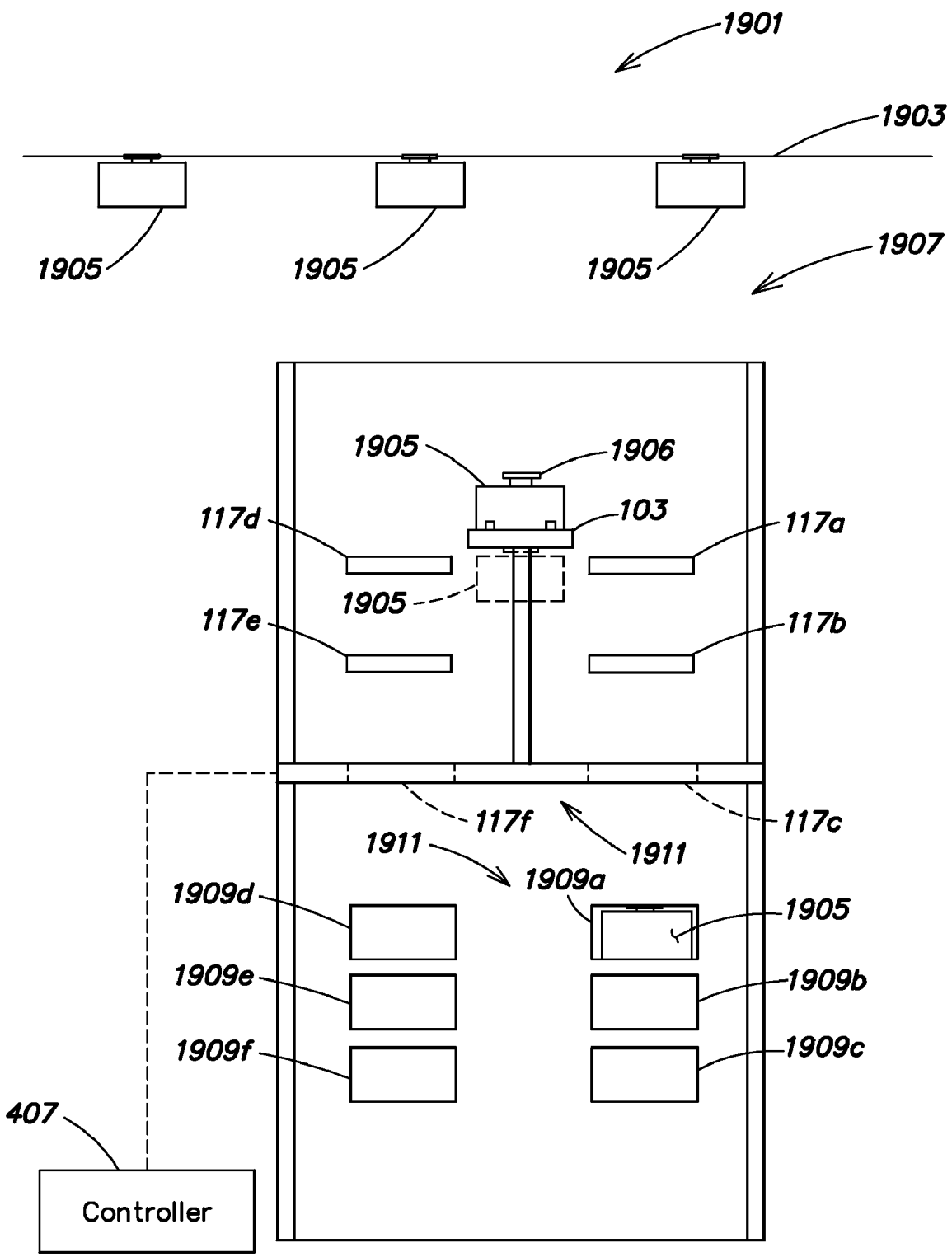
FIG. 19 is a schematic, front view of a system for transporting substrate carriers in accordance with an embodiment of the present invention.

FIG. 19 is a schematic, front view of a system 1901 for transporting substrate carriers in accordance with the present invention. With reference to FIG. 19, the system 1901 includes an overhead conveyor system 1903 adapted to transport substrate carriers 1905 between a plurality of processing tools, including a first processing tool 1907 shown in FIG. 19.

In one or more embodiments of the invention, the overhead conveyor system 1903 may be configured as shown in previously incorporated U.S. patent application Ser. Nos. 10/650, 310 and 10/650,480, both filed Aug. 28, 2003, and adapted to be continuously in motion. Other overhead conveyor systems, including conveyor systems that are not continuously in motion, may be used. In the embodiment of FIG. 19, the overhead conveyor system 1903 is adapted to support substrate carriers 1905 by the overhead transfer flange 1906 of each substrate carrier 1905.

The processing tool 1907 includes the end effector 103, which is adapted to support a substrate carrier 1905 via a bottom of the substrate carrier 1905 or via an overhead transfer flange 1906 of the substrate carrier 1905 (as shown in phantom). The processing tool 1907 includes a plurality of load ports 1909a-f separated into two columns as shown. Other configurations and/or numbers of load ports may be used. Each load port 1909a-f may be adapted to support, dock and/or open a substrate carrier 1905 (e.g., to allow substrates within the substrate carrier 1905 to be extracted and processed within the processing tool 1907), as well as to undock and/or close a substrate carrier 1905. In the embodiment shown, each load port 1909a-f is adapted to support a substrate carrier 1905 by a bottom of the substrate carrier.

The processing tool 1907 also includes a plurality of support locations 117a-f. Other numbers and/or arrangements of support locations 117a-f may be used. An open region or tunnel 1911 exists between the columns of support locations 117a-f and load ports 1909a-f that defines an area in which the end effector 103 may be moved along the z-axis (e.g., vertically) without contacting other support locations and/or load ports.

The controller 407 is coupled to the processing tool 1907 and may be adapted to control operation of the processing tool 1907, including operation of the end effector 103 as previously described (e.g., so as to perform methods 601 or 1801).

During exemplary operation of the system 1901, a substrate carrier 1905 may be unloaded from the overhead conveyor system 1903 using the end effector 103 to support the substrate carrier 1905 via a bottom of the substrate carrier 1905 (see, for example, U.S. patent application Ser. Nos. 10/650,310 and 10/650,480, both filed Aug. 28, 2003). The substrate carrier 1905 then may be placed on one of the support locations 117a-f and the end effector 103 may be repositioned to support the substrate carrier 1905 via its overhead transfer flange 1906 (as previously described). The substrate carrier 1905 then may be transferred from the support location 117a-f to one of the load ports 1909a-f and supported at the respective load port via a bottom of the substrate carrier 1905. The substrate carrier 1905 then may be docked and opened at the load port, and the substrates of the substrate carrier 1905 may be processed within the processing tool 1907. Thereafter, the substrate carrier 1905 may be closed and undocked at the load port. The end effector 103 then may transfer the substrate carrier 1905 from the respective load port to one of the support locations 117a-f, supporting the substrate carrier 1905 via its overhead transfer flange. Thereafter, the end effector 103 may be repositioned (as previously described) to support the substrate carrier 1905 via the bottom of the substrate carrier 1905. The substrate carrier 1905 then may be loaded onto the overhead conveyor system 1903 via the end effector 103 and transported to another processing tool (not shown) or other location within a fabrication facility. The controller 407 may include computer program code for performing any of the above steps. The steps of loading/unloading a substrate carrier onto/from the overhead conveyor system 1903 may be performed while the conveyor system is stopped or in motion.

While the present invention has been described primarily with reference to FOUPs, it will be understood that other types of substrate carriers may be employed (e.g., bottom opening substrate carriers, top opening substrate carriers, etc.). Likewise, the present invention may be used with small lot size or large lot size substrate carriers. As used herein, a "small lot" size substrate carrier refers to a substrate carrier that is adapted to hold significantly fewer substrates than a conventional "large lot" size substrate carrier which typically holds 13 or 25 substrates. As an example, in one embodiment, a small lot size substrate carrier is adapted to hold 5 or less substrates. Other small lot size substrate carriers may be employed (e.g., small lot size carriers that hold 1, 2, 3, 4, 5, 6, 7 or more substrates, but significantly less than that of a large lot size substrate carrier). For example, in one embodiment, each small lot size substrate carrier may hold too few substrates for human transport of substrates carriers to be viable within a semiconductor device manufacturing facility.

Accordingly, while the present invention has been disclosed in connection with exemplary embodiments thereof, it should be understood that other embodiments may fall within the spirit and scope of the invention as defined by the following claims.

The invention claimed is:

1. A substrate carrier transferring system comprising:
an end effector having one or more end effector pins on a top surface thereof, and having one or more end effector flanges on a bottom surface thereof, wherein the end effector is adapted to support a substrate carrier by a bottom of the substrate carrier via the one or more end effector pins and support the substrate carrier by coupling the one or more end effector flanges to an overhead transfer flange of the substrate carrier;
an intermediate support location; and
a controller coupled to the end effector and adapted to:
employ the end effector to support the substrate carrier by the overhead transfer flange of the substrate carrier via the one or more end effector flanges;

transfer the substrate carrier from the end effector to the intermediate support location, wherein the intermediate support location supports the substrate carrier by the bottom of the substrate carrier;
reposition the end effector proximate the bottom of the substrate carrier;
employ the end effector to support the substrate carrier by the bottom of the substrate carrier via the one or more end effector pins; and
transfer the substrate carrier from the intermediate support location.

2. The substrate carrier transferring system of claim 1 wherein the controller is further adapted to employ the one or more end effector flanges are on a bottom side of the end effector to slide beneath and couple to the overhead transfer flange of the substrate carrier.

3. The substrate carrier transferring system of claim 1 wherein the controller is further adapted to employ the one or more end effector pins in the top side of the end effector to couple to slots in the bottom of the substrate carrier and support the substrate carrier by the bottom of the substrate carrier.

4. The substrate carrier transferring system of claim 1 wherein the controller is further adapted to reposition the end effector proximate the bottom of the substrate carrier by moving the end effector vertically in a region laterally displaced from the substrate carrier.

5. The substrate carrier transferring system of claim 1 wherein the controller is further adapted to move the end effector such that pins on a top side of the intermediate support location couple to corresponding slots in the bottom of the substrate carrier and pins coupled to a bottom side of the end effector no longer couple to corresponding slots of the substrate carrier overhead transfer flange.

6. The substrate carrier transferring system of claim 1 wherein the controller is further adapted to move the end effector such that pins on a top side of the end effector couple to corresponding slots in the bottom of the substrate carrier and pins on a top side of the intermediate support location no longer couple to corresponding slots in the bottom of the substrate carrier.

7. The substrate carrier transferring system of claim 2, further comprising one or more sensors coupled to the one or more end effector flanges, wherein the one or more sensors are adapted to sense alignment of the one or more end effector flanges with the overhead transfer flange.

8. The substrate carrier transferring system of claim 2 wherein a top surface of one or more of the end effector flanges has one or more pins adapted to couple to one or more corresponding overhead transfer flange slots.

* * * * *